United States Patent
Juni et al.

(10) Patent No.: US 7,722,965 B2
(45) Date of Patent: May 25, 2010

(54) ELECTROLUMINESCENCE DEVICE, PLANAR LIGHT SOURCE AND DISPLAY USING THE SAME

(75) Inventors: Noriyuki Juni, Ibaraki (JP); Toshitaka Nakamura, Ibaraki (JP); Yuji Hotta, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 925 days.

(21) Appl. No.: 10/934,727

(22) Filed: Sep. 7, 2004

(65) Prior Publication Data

US 2005/0142379 A1 Jun. 30, 2005

(30) Foreign Application Priority Data

Dec. 26, 2003 (JP) ............ P. 2003-433726
Jan. 20, 2004 (JP) ............ P. 2004-011452

(51) Int. Cl.
  *H01J 1/62* (2006.01)
  *B32B 7/02* (2006.01)

(52) U.S. Cl. ............ 428/690; 428/212; 428/323; 428/917; 313/504; 313/506; 257/98; 257/99; 257/100; 257/101; 257/102

(58) Field of Classification Search ........... 428/690, 428/917; 257/40, 98; 313/504, 506
See application file for complete search history.

(56) References Cited

U.S. PATENT DOCUMENTS

| 3,929,733 | A | 12/1975 | Alberino et al. |
| 4,225,698 | A | 9/1980 | Medem et al. |
| 4,353,954 | A | 10/1982 | Yamaoka et al. |
| 5,008,363 | A | 4/1991 | Mallon et al. |
| 5,079,326 | A | 1/1992 | Suzuki et al. |
| 5,093,214 | A | 3/1992 | Saito et al. |
| 5,264,518 | A | 11/1993 | Amano |
| 5,338,794 | A | 8/1994 | Imashiro et al. |
| 5,360,933 | A | 11/1994 | Imashiro et al. |
| 5,373,080 | A | 12/1994 | Imashiro et al. |

(Continued)

FOREIGN PATENT DOCUMENTS

EP 0 281 381 B1 7/1988

(Continued)

OTHER PUBLICATIONS

Takuya Ogawa et al., "Study on the Conduction Mechanism of Organic Light-Emitting Diode Using One-Dimensional Discontinuous Model", IEICE Trans Electron (2002), vol. E85-C, No. 6, pp. 1239-1244.

(Continued)

*Primary Examiner*—D. Lawrence Tarazano
*Assistant Examiner*—Camie S Thompson
(74) *Attorney, Agent, or Firm*—Sughrue Mion, PLLC

(57) ABSTRACT

The present invention provides an organic electroluminescence device including an organic layer comprising an emissive layer; a pair of electrodes comprising an anode and a cathode, and sandwiching the organic layer, wherein at least one of the electrodes is transparent; a transparent layer provided adjacent to a light extracting surface of the transparent electrode; and a region substantially disturbing reflection and retraction angle of light provided adjacent to a light extracting surface of the transparent layer or in an interior of the transparent layer, wherein the transparent layer has a refractive index substantially equal to or more than the refractive index of the emissive layer.

12 Claims, 10 Drawing Sheets

U.S. PATENT DOCUMENTS

| | | | |
|---|---|---|---|
| 5,393,839 A | 2/1995 | Iwamoto | |
| 5,416,184 A | 5/1995 | Amano et al. | |
| 5,574,083 A | 11/1996 | Brown et al. | |
| 5,650,476 A | 7/1997 | Amano et al. | |
| 5,916,675 A | 6/1999 | Komoto et al. | |
| 6,143,409 A | 11/2000 | Komoto et al. | |
| 6,144,108 A | 11/2000 | Ohizumi et al. | |
| 6,248,857 B1 | 6/2001 | Misumi et al. | |
| 6,392,338 B1* | 5/2002 | Hori et al. | 313/504 |
| 6,411,439 B2 | 6/2002 | Nishikawa | |
| 6,432,328 B2 | 8/2002 | Hamanaka et al. | |
| 6,437,918 B1 | 8/2002 | Hamanaka et al. | |
| 6,485,833 B1 | 11/2002 | Imashiro et al. | |
| 6,492,484 B2 | 12/2002 | Misumi et al. | |
| 6,597,509 B2 | 7/2003 | Takakuwa et al. | |
| 6,652,688 B2 | 11/2003 | Matsumura et al. | |
| 6,825,056 B2* | 11/2004 | Asakawa et al. | 438/47 |
| 7,190,525 B2* | 3/2007 | Ito et al. | 359/599 |
| 2003/0034128 A1 | 2/2003 | Matsumura et al. | |
| 2003/0068841 A1 | 4/2003 | Matsumura et al. | |
| 2004/0241421 A1 | 12/2004 | Ootsuka et al. | |
| 2005/0030444 A1* | 2/2005 | Fujiwara et al. | 349/64 |

FOREIGN PATENT DOCUMENTS

| | | |
|---|---|---|
| EP | 0823831 | 2/1998 |
| EP | 991306 A1 | 4/2000 |
| EP | 1 125 956 A1 | 8/2001 |
| EP | 1120838 | 8/2001 |
| EP | 1121000 | 8/2001 |
| EP | 1435762 | 7/2004 |
| GB | 851936 | 10/1960 |
| JP | 63-314795 A | 12/1988 |
| JP | 4-268505 A | 9/1992 |
| JP | 5-3081 A | 1/1993 |
| JP | 06-059102 | 3/1994 |
| JP | 6-151061 A | 5/1994 |
| JP | 06-208005 | 7/1994 |
| JP | 6-347617 A | 12/1994 |
| JP | 08-222374 * | 2/1995 |
| JP | 08-208788 | 8/1996 |
| JP | 8-271892 A | 10/1996 |
| JP | 09-059338 | 3/1997 |
| JP | 9-506984 A | 7/1997 |
| JP | 9-507308 A | 7/1997 |
| JP | 10-020295 | 1/1998 |
| JP | 10-251406 A | 9/1998 |
| JP | 10-251595 A | 9/1998 |
| JP | 10-321371 A | 12/1998 |
| JP | 11-168235 | 6/1999 |
| JP | 11-211902 | 8/1999 |
| JP | 11-214162 A | 8/1999 |
| JP | 11-214163 A | 8/1999 |
| JP | 11-231132 A | 8/1999 |
| JP | 11-283751 A | 10/1999 |
| JP | 11297479 | 10/1999 |
| JP | 11-316376 A | 11/1999 |
| JP | 2000-002803 | 1/2000 |
| JP | 2000-049387 | 2/2000 |
| JP | 2000013025 A | 2/2000 |
| JP | 2000-182774 A | 6/2000 |
| JP | 20000204157 A | 7/2000 |
| JP | 2000-275405 | 10/2000 |
| JP | 2000-304906 | 11/2000 |
| JP | 2000-321675 | 11/2000 |
| JP | 2001166114 | 6/2001 |
| JP | 2001-203074 A | 7/2001 |
| JP | 2001223078 | 8/2001 |
| JP | 2001-244080 A | 9/2001 |
| JP | 2001-272507 | 10/2001 |
| JP | 2001-311826 A | 11/2001 |
| JP | 2001-313178 A | 11/2001 |
| JP | 2001-356207 A | 12/2001 |
| JP | 2003-156604 A | 5/2003 |
| WO | WO 95/17691 A1 | 6/1995 |
| WO | WO 95/17699 A1 | 6/1995 |
| WO | 02/37568 A1 | 5/2002 |
| WO | 02/37580 A1 | 5/2002 |
| WO | 03026357 | 3/2003 |

OTHER PUBLICATIONS

M.H. Lu et al., "Optimization of external coupling and light emission in organic light-emitting devices: modeling and experiment", Journal of Applied Physics (2002), vol. 91, No. 2, pp. 595-604.

J. McElvain et al., "Formation and growth of black spots in organic light-emitting diodes", J. Appl. Phys. (1996), vol. 80, No. 10, pp. 6002-6007.

Asuka Yamamori et al., "Transparent organic light-emitting diodes using metal acetylacetonate complexes as an electron injective buffer layer", Applied Physics Letters (2001), vol. 78, No. 21, pp. 3343-3345.

Michio Matsumura et al., "Emission zone in organic light-emitting devices having a single layer of polyphenylenevinylene derivatives", Applied Physics Letters (2001), vol. 79, No. 27, pp. 4491-4493.

T. Matsumoto et al., "Bright Organic EL Device", Optronics (2003), No. 2, pp. 136-139.

Japanese Office Action, corresponding to Application No. 2004-011452, dated Nov. 10, 2009.

Oishi, Y., Tokuda, Y. Hidetoshi, H. And Mori, K. "Preparation and Properties of Aromatic Polycarbodiimides from Aromatic Diisocyanates", Journal of Photopolymer Science and Technology, May 27, 1998, pp. 245-248, vol. 11, No. 2, Morioka, Japan.

Yamasaki, T., Sumioka, K. And Tsutsui, T. "Organic Light-Emitting Device with an Ordered Monolayer of Silica Microspheres as a Scattering Medium" Applied Physics Letters, Mar. 6, 2000, pp. 1243-1245, vol. 76, No. 10, Fukuoka, Japan.

* cited by examiner

ELECTROLUMINESCENCE DEVICE, PLANAR LIGHT SOURCE AND DISPLAY USING THE SAME

FIELD OF THE INVENTION

The present invention relates to an electroluminescence device (hereinafter, referred to as "EL device") which is excellent in light-emitting efficiency, and particularly excellent in extracting emitted light to the outside; and to a highly efficient planar light source using the EL device and a display using the same.

BACKGROUND OF THE INVENTION

An EL device, which includes an emissive layer sandwiched between a pair of electrodes consisting of an anode and a cathode, and from which light emission is electrically obtained, has been actively researched not only for application to a display device, but also for application to a variety of light sources, such as a flat-type illumination source, a light source for optical fiber, a backlight for liquid crystal display, or a backlight for a liquid crystal projector.

Particularly, in recent years efforts have been focused on an organic EL device (Organic Light Emitting Diode), in view of its advantages of high light-emitting efficiency, capability of being driven under low-voltage, light weight, and low cost. In the above-described applications as a light source, enhancement in light-emitting efficiency is of primary concern. Accordingly, improvements in the configuration and material for the EL device, a driving method thereof, a manufacturing method thereof, or the like, have been contemplated with an aim of obtaining light-emitting efficiency comparable with that of a fluorescent light.

However, in relation to an in-solid light-emitting device, such an EL device, where light emission is extracted from an emissive layer per se, light emitted at an angle larger than a critical angle, which is determined by a refraction index of the emissive layer and that of a member from which light exits, undergoes total reflection and is confined inside, and thereby lost as waveguide light.

According to a calculation based on Snell's law of refraction, which is the classical theory of refraction, a light extraction efficiency $\eta$, which is an efficiency at which generated light is extracted to the outside, is given by the approximate expression: $\eta = \frac{1}{2}n^2$, where "n" denotes the refractive index of the emissive layer. When the refractive index of the emissive layer is assumed to be 1.7, $\eta$ is approximately 17%. That is, not less than 80% of the light is lost as waveguide light; more specifically, lost in the form of light lost in the direction along the device side face.

Meanwhile, in the organic EL device, among excitons generated by means of re-combination of electrons injected from an electrode and holes, only singlet excitons contribute to light emission. The probability of a generated exciton being a singlet exciton is $\frac{1}{4}$. Accordingly, when merely the above is taken into consideration, the efficiency is not more than 5% and fairly low. However, recent years have seen progress in development of light-emitting materials which are capable of emitting light also from phosphorescence from triplet excitons as a method for improving light-emitting efficiency of an emissive layer per se (Reference 1). Accordingly, potential for radical enhancement in quantum efficiency has been seen.

However, even when the quantum efficiency is improved, light-extraction efficiency reduces the resulting light-emitting efficiency in a ratio multiplied by the quantum efficiency. In other words, improvement in the light-extraction efficiency may bring about a radical increase in the light-emitting efficiency as a synergetic effect.

Examples of methods to extract the waveguide light to the outside include: formation of a region disturbing reflection angle and refraction angle of light (hereinafter referred to as "region disturbing reflection/refraction angle of light"), thereby changing variables of Snell's law and changing a transmission angle of light which is supposed to undergo total reflection; and imparting a light-condensing property to light emission per se. However, formation of such a region which allows all the waveguide light to be guided to the outside is not easy. Therefore, a number of proposals have been put forth for extracting as much waveguide light as possible.

For instance, as methods for improving light-extraction efficiency, there have been proposed a method for enhancing light-extraction efficiency by means of imparting a light-condensing property to a substrate per se (Reference 2); a method of configuring the emissive layer from discotic liquid crystal, to thus improve frontal directivity of emitted light per se (Reference 3); and a method of forming a stereo structure, an inclined surface, a diffraction grating, or the like in the device (References 4, 5 and 6). The above proposals, however, entail problems such that configuration is complicated, and light-emitting efficiency of the emissive layer per se is low.

Examples of a relatively simple method include formation of a light diffusion layer so as to change the refraction angle of light, to thus reduce the amount of light which undergoes total reflection. For instance, there have been made a number of proposals such that a diffusion plate wherein particles are dispersed in a transparent substrate, and the particles have a structure of gradient-refractive index, which is a structure in which the refractive index on the inner side differs from that of the surface side (see Reference 7); a diffusion member in which a single-particle layer is arranged on a translucent substrate (see Reference 8); and a method of dispersing scattering particles in the same material as that of the emissive layer (see Reference 9).

The above proposals have been made by focusing on characteristics of scattering particles, a refractive index difference from a dispersion matrix, a dispersing form of particles, a location for forming a scattering layer, and the like.

In addition, there has been proposed a method for improving a diffusing function of the light-scattering film for use with a liquid crystal display apparatus (see Reference 10); more specifically, a method of dispersing inorganic particles in a resin so as to increase the refractive index difference, to thus improve a diffusing function. However, the proposals do not include such a concept of extracting lost light, which is supposed to be confined inside the EL device and lost as waveguide light, thereby improving light-emitting efficiency.

Meanwhile, as is the case with the EL device, with regard to a light-emitting device which is configured such that an organic thin film or an inorganic thin film where an emissive layer is disposed between a pair of electrodes, a transparent electrode is employed for an electrode on the light extraction surface. For the transparent electrode, indium tin oxide (ITO), which is obtained by doping tin oxide with indium oxide, is widely employed, in view of its excellent transparence and electric conductivity.

The refractive index of ITO varies, depending on its composition, deposition method, or crystal structure, and is in the range of approximately 1.9 to 2.0. That is, ITO is a material having considerably-high refractive-index.

On the other hand, for a transparent substrate for use in an organic EL device, glass is generally used in view of its excellent transparency, strength, gas barrier property, chemical resistance, heat resistance and so on. The refractive index of typical soda lime glass, for example, is about 1.52.

A light emitting material used for the emissive layer of the organic EL device and an organic layer such as an electron transfer material, a hole transfer material generally have a refractive index of about 1.65 to 1.75, which is relatively high as compared with a typical organic material because of the π-conjugated bond system including many benzene rings in the molecular structure.

In such an organic EL device, light generated in the emissive layer is directed to all spaces. When the above-described relationship of the refractive index exists, total reflection occurs not only at the interface between the glass substrate and the air layer but also at the interface between the ITO layer and the glass substrate.

Specifically, in FIG. 7, provided that the refractive index of the emissive layer is 1.7, that of the ITO layer is 1.9, that of the glass substrate is 1.52, and that of the air layer is 1, total reflection does not occur when the light is transmitted from the emissive layer to the ITO layer, because the refractive index of the ITO layer is higher than that of the emissive layer, so that all the light enters the ITO layer except the light reflected at the surface. However, since the refractive index of the emissive layer is higher than that of the glass layer, there exists a critical angle.

For this reason, light having a transmission angle larger than the critical angle undergoes total reflection at the interface between the ITO and the glass substrate, and is confined inside the device. Further, incident light entering the glass substrate undergoes total reflection at the interface between the glass and the air, to thereby be confined inside the device. When ratios with regard to the above are calculated in consideration of the solid angles, light which is allowed to exit to the outside totals approximately 20%, light which is reflected at the interface between the glass and the air totals approximately 35%, and light which is reflected at the interface between the ITO and the grass totals approximately 45%. Hereinafter, the interface between A and B is referred to as "A/B interface".

Accordingly, when an organic EL device is configured as described above, even when a light diffusion layer is formed on a glass substrate, light allowed to be extracted therefrom is merely that reflected at the glass/air interface. That is, the configuration exerts no effects on light reflected at the ITO/glass interface. Additionally, as described hitherto, calculation based on classical theory shows that approximately 45% of the emitted light is lost at the ITO/glass interface.

Examples of conceivable methods for solving the above problem include a method of: employing a glass having a high refractive index equal to or greater than that of the emissive layer as a glass substrate, and forming a light diffusion layer on the surface; a method of forming a light diffusion layer made from a high-refractive-index material between the ITO and the glass substrate; and a method of inserting a high-refractive-index layer which is sufficiently thicker than a wavelength of the light, and forming the aforementioned light diffusion layer on the surface of the high-refractive-index layer.

However, the high-refractive-index glass has a problem in that its cost is generally high. Furthermore, manufacturing a light diffusion layer or a microlens structure made from a highly refractive material requires a resin material of excellent workability. However, a general resin material, even that of a highly refractive material, has a refractive index not greater than 1.65. A special resin whose refractive index is approximately 1.7 is available; however, such a resin is considerably expensive.

In addition, a thin, high-refractive-index layer having a thickness of not more than 1 μm can be manufactured with relatively ease by means of a thin film deposition method such as a vacuum deposition method, a sputtering method, or a sol-gel method. However, forming a highly refractive layer which is sufficiently thicker than the wavelength of light, as described above, is significantly difficult because of problems, such as deposition speed of the film, or generation of cracks caused by internal stress. Therefore, exception has arisen for a material which is inexpensive and easily applicable.

An organic EL device relies upon the principle that holes injected from an anode and electrons injected from a cathode are recombined by application of an electric field to form excitons and thereby cause a fluorescent (or phosphorescent) substance to emit light. In order to achieve an improved quantum efficiency, therefore, it is necessary for such recombination to take place efficiently. For that purpose, it is usual to make an element in the form of a laminated structure. Examples of the laminated structure include: a two-layer configuration having a hole transfer layer and an electron transfer emissive layer; and a three-layer configuration having a hole transfer layer, a emissive layer and an electron transfer layer. There have also been proposed many laminated elements having a double heterojunction structure for improved efficiency. Hereinafter, a laminated configuration having layer A, layer B and layer C is referred to as "configuration of layer A/layer B/layer C".

In a laminated structure, recombination occurs almost exclusively in a certain region. In an organic EL device of the two-layer type as mentioned above, for example, it occurs intensively in a region 6 which is separated from by about 10 nm to the electron transfer emissive layer from an interface between a hole transfer layer 4 and an electron transfer emissive layer 5 which are sandwiched between a reflective electrode 3 and a transparent electrode 2 on a support substrate 1, as shown in FIG. 10 (as reported by Takuya Ogawa, et al.: IEICE TRANS ELECTRON, Vol. E85-C, No. 6, page 1239, 2002).

The light generated in the light emitting region 6 is radiated in all directions. As a result, there occurs a difference in light path between light radiated through the transparent electrode 2 toward its light-emitting surface and light radiated toward and reflected by the reflective electrode 3 and thereby radiated toward the light-emitting surface, as shown in FIG. 11.

Referring to FIG. 11, the electron transfer light-emitting layer of an organic EL device usually has a thickness in the range of several dozen to a hundred and several dozen nanometers, that is in the order of the wavelength of visible light. Accordingly, beams of light going out finally interfere with one another and are strengthened or weakened by one another, depending on the distance d between the light emitting region and the reflective electrode.

While only light radiated in a frontal direction is shown in FIG. 11, there actually exists light radiated obliquely, and interference occurs in a different way depending on the distance d, the wavelength λ of emitted light and the angle of radiation. As a result, it is possible that beams of light radiated in a frontal direction are strengthened by one another, while beams radiated at a wide angle are weakened, or vice versa. In other words, the luminance of emitted light depends on the visual angle. It is, of course, true that as the distance d increases, the intensity of light varies more remarkably with the angle. Therefore, the film thickness is usually so selected that the distance d may be equal to about one-fourth of the wavelength of emitted light to ensure that beams of light in a frontal direction be strengthened by one another.

If the distance d is smaller than, for example, about 50 nm, the reflective electrode which is usually made of a metal absorbs light markedly and thereby brings about a reduction in luminous intensity and an adverse effect on intensity distribution. In other words, an organic EL device has a distribution of radiated light varying markedly with the distance d between its light-emitting region and reflective electrode and a corresponding large variation in the waveguide light component mentioned above.

Moreover, the emission spectrum of an organic electroluminescence device has broad characteristics over a relatively wide range of wavelengths. Therefore, the range of wavelengths in which beams are strengthened by one another varies with the distance d, and thereby causes light to have a varying peak wavelength. The emission spectrum varies with the visual angle, too, depending on the distance d.

In order to solve those problems, it has been proposed that the film thickness be so selected as to suppress any difference occurring to the color of light with the visual angle (see Reference 11). There is, however, no statement concerning waveguide light. Furthermore, the film thickness proposed for suppressing the visual angle dependence of the color of light definitely differs from the range according to this invention as will be stated later.

For the reasons stated above, it is impossible to estimate correctly the output efficiency of a laminated organic EL device by a classical calculation based on the understanding that about 80% of emitted light is confined within the device as waveguide light. In other words, the waveguide light component depends markedly on the structural features of the element. For example, M. H. Lu, et al. report a detailed study made of any variation in waveguide light due to the structural features of the element by using a quantum mechanical method of calculation taking a microcavity effect into aocount (J. Appl. Phys., Vol. 91, No. 2, page 595, 2002).

Further, as described above, there have not yet been put forth proposals which focus on the waveguide light of the EL device; particularly, there have not yet been proposed EL devices in which waveguide light undergoes total reflection at the interface between the transparent electrode and the glass substrate, which extract such light efficiently, and which exhibit improved light-emitting efficiency. Moreover, high refractive index materials applicable for such an application, particularly resin materials exhibiting excellent workability, have not been found in large number.

[Reference 1] JP2001-313178A
[Reference 2] JP63-314795A
[Reference 3] JP10-321371A
[Reference 4] JP11-214162A
[Reference 5] JP11-214163A
[Reference 6] JP11-283751A
[Reference 7] JP6-347617A
[Reference 8] JP2001-356207A
[Reference 9] JP6-151061A
[Reference 10] JP2003-156604A
[Reference 11] JP5-3081A
[Reference 12] EP281381B In view of above circumstances, an object of the present invention is to provide an EL device which has excellent light-emitting efficiency by virtue of being capable of efficiently extracting lost light which is supposed to be confined inside the EL device as waveguide light. Other object of the present invention is to provide a highly efficient planar light source and a display employing such an EL device as described above.

SUMMARY OF THE INVENTION

The present inventors have made eager investigation to examine the problem. As a result, followings has been found.

FIG. 7 is a schematic drawing showing light directed outwardly from the light-emitting region of the two-layer organic EL device shown in FIG. 10, only in respect of its upper semispherical area. It omits light directed toward the reflective electrode, though it actually exists.

Referring to FIG. 7, light radiated in all directions first undergoes total internal reflection by the interface between the transparent electrode and the glass substrate and confined internally. This is because the refractive index of the glass substrate is generally about 1.52, which is lower than that of the emissive layer. According to a classical calculation, the loss of light at the interface is about 45% of the total emission, provided that the refractive index of the emissive layer is 1.7 while that of the glass substrate is 1.52. Then, light transmitted to the glass substrate undergoes total internal reflection by the interface between it and air and confined internally. According to a similar calculation, the loss of light at the interface is about 35% of the total emission. Thus, it is only 20% that is externally emitted and reaches the viewer.

In the bi-layer organic EL device shown in FIG. 7 (FIG. 10), when a light diffusion layer as a region 8 for disturbing the reflection/refraction angle is formed on the base substrate (glass substrate) as shown in FIG. 8, part of the transmitted light which is to be totally reflected at the air/glass interface can be guided to the outside by diffusing the light. With this method, however, only the light to be totally reflected at the air/glass interface can be extracted, and the light totally reflected at the interface between the glass substrate and the transparent electrode cannot even become incident on the region 8 and hence does not contribute to the enhancement of the light-extraction efficiency.

To solve the above problem, the inventors of the present invention have performed further studies to find the following; When a transparent layer having a refractive index substantially equal to or higher than that of the emissive layer is formed adjacent to the transparent electrode to diffuse and refract light, the light to be totally reflected at the interface between the glass substrate and the transparent electrode can also be guided to the outside, which produces an effect with respect to about 80% of the total amount of light.

For the understanding of this point, FIG. 9 shows the condition when the refractive index of the base substrate 1 is made equal to that of the emissive layer in the bi-layer organic EL device shown in FIG. 7 (FIG. 10). As described above, all of the light emitted from the emissive layer is transmitted to the transparent electrode having a high refractive index. Thereafter, when the light becomes incident on the base substrate, total reflection occurs if the refractive index of the substrate is lower than that of the emissive layer. However, when the refractive index of the substrate is substantially equal to or higher than that of the emissive layer, the critical angle does not exist in accordance with Snell's law, so that all the light can enter the base substrate.

When the refractive index of the base substrate increases, the critical angle at the interface between air and the base substrate decreases, and similarly to the above, only 20% of the total amount of light can be extracted to the outside. However, unlike the light confined in an extremely thin film having a thickness of several hundreds nm even in total, the extraction of the light from a relatively thick layer such as the base substrate can be performed without deteriorating the performance of the organic EL device, if only the light is guided to the thick layer.

An actual organic EL device causes an interference of light, as already stated. The device is usually so constructed that the frontally directed beams of light which can be externally emit may be strengthened by one another. However, the interference of waveguide light so occurs that beams are weakened by one another. Then, no region for disturbing reflection/refraction angle of light can be expected to realize any greatly improved luminance.

The present inventors have, however, selected the structural features of the device so that wide-angled beams of light which is usually confined within the device as waveguide light may be strengthened by one another, while the frontally directed beams of light are weakened, as is different from the above-mentioned conventional method, and formed a region for disturbing reflection/refraction angle of light after amplifying waveguide light having a distribution of the greater part of light, and found it possible to achieve an improved light-emitting efficiency over the prior art.

In other words, the present inventors have found that an organic EL device having the structural features mentioned above and also having a region for disturbing reflection/refraction angle eventually shows a higher light-emitting efficiency than when such a region is formed in any device of the known construction, while the organic EL device having the structural feature and not having the region has a low efficiency.

The first aspect of the present invention (hereinafter referred to as "first invention") has been accomplished with the foregoing findings.

Further, the inventors have found the following after having made eager investigation to examine the problem. In an EL device having an emissive layer sandwiched between a pair of electrodes consisting of an anode and a cathode, when a diffusion layer is disposed adjacent to the electrodes on a light extraction surface side (transparent electrode), and when the diffusion layer contains at least two kinds of fine particles which differ in mean particle size by a large extent dispersed therein, lost light which is supposed to be confined inside the EL device as waveguide light can be extracted efficiently. Thereby, an EL device of excellent light-extraction efficiency can be obtained.

The second aspect of the present invention (hereinafter referred to as "second invention") has been accomplished with the foregoing findings.

The present invention is mainly directed to the following items:

(1) An organic electroluminescence device comprising: an organic layer comprising an emissive layer; a pair of electrodes comprising an anode and a cathode, and sandwiching the organic layer, wherein at least one of the electrodes is transparent; a transparent layer provided adjacent to a light extracting surface of the transparent electrode; and a region substantially disturbing reflection and refraction angle of light provided adjacent to a light extracting surface of the transparent layer or in an interior of the transparent layer, wherein the transparent layer has a refractive index substantially equal to or more than the refractive index of the emissive layer.

(2) The organic electroluminescence device according to item 1, wherein the transparent layer has a refractive index of not less than 1.7.

(3) The organic electroluminescence device according to item 1, wherein the region substantially disturbing reflection and refraction angle of light comprises: a first transparent material; and a second transparent material or an opaque material having a mean particle size of 0.2 to 20 μm, and dispersed in the first transparent material, wherein the second transparent material or the opaque material has a refractive index different from that of the first transparent material.

(4) The organic electroluminescence device according to item 1, wherein the region substantially disturbing reflection and refraction angle of light comprises a lens structure.

(5) The organic electroluminescence device according to item 1, wherein the region substantially disturbing reflection and refraction angle of light comprises an irregular surface having a surface roughness of not less than 1 μm.

(6) The organic electroluminescence device according to item 1, wherein the transparent layer comprises a polycarbodiimide resin represented by the following general formula (I):

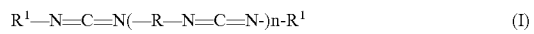

$$R^1\text{—}N\text{=}C\text{=}N(\text{—}R\text{—}N\text{=}C\text{=}N\text{-})n\text{-}R^1 \quad (I)$$

wherein R, $R^1$ and n represent organic diisocyanate residue, organic monoisocyanate residue and an integer of 1 to 100, respectively.

(7) The organic electroluminescence device according to item 6, wherein not less than 10 mol % of organic diisocyanate residue R is naphthalene diisocyanate residue.

(8) The organic electroluminescence device according to item 6, wherein organic monoisocyanate residue $R^1$ is 1-naphthylisocyanate residue.

(9) The organic electroluminescence device according to item 1, wherein at least one kind of fine particles having a mean particle size of 1 to 100 nm are dispersed in the transparent layer.

(10) The organic electroluminescence device according to item 1, wherein the organic layer and the pair of electrodes are formed so that a front brightness and a brightness in 50 to 70 degrees direction of emitted light directed from the light extracting surface satisfy the formula (1), provided that the transparent layer and the region substantially disturbing reflection and refraction angle of light are not provided:

$$\text{front brightness} < \text{brightness in 50 to 70 degrees direction} \quad (1)$$

(11) The organic electroluminescence device according to item 10, wherein the pair of electrodes comprise a reflective electrode and a transparent electrode, and further satisfy the following formula (2):

$$(0.3/n)\lambda < d < (0.5/n)\lambda \quad (2)$$

wherein d represents a distance (nm) between the center of an electron-hole recombination emission region and the reflective electrode, λ represents a peak wavelength of fluorescent spectrum of a material used for the emissive layer, and n represents a refractive index of the organic layer between the emissive layer and the reflective electrode.

(12) A surface light source comprising an organic electroluminescence device according to item 1.

(13) A display comprising an organic electroluminescence device according to item 1.

(14) An electroluminescence device comprising: an emissive layer; a pair of electrodes comprising an anode and a cathode, and sandwiching the emissive layer; and a diffusion layer provided adjacent to a light extracting surface of the transparent electrode, wherein the diffusion layer comprises: a resin; and at least two kinds of fine particles dispersed in the resin, which differ in mean particle size such that the particle size of larger fine particles are at least ten times as large as that of smaller fine particles.

(15) The electroluminescence device according to item 14, wherein the two kinds of fine particles comprise: ultra-fine particles having a mean particle size of 1 to 100 nm; and fine particles having a mean particle size of more than 0.1 μm and not more than 50 μm.

(16) The electroluminescence device according to item 15, wherein the device satisfies the following formulas:

$$n_1 \geq 1.9$$

$$|[n_0 \cdot q + n_1 \cdot (1-q)] - n_2| \geq 0.05 \quad (3)$$

wherein $n_0$ represents the refractive index of a resin; $n_1$ represents the refractive index of the ultra-fine particles having a mean particle size of 1 to 10 nm, dispersed in the resin; $n_2$ represents the refractive index of the fine particles having a mean particles size is more than 0.1 μm and not more than 50 μm, dispersed in the resin; "q" represents a volume fraction of the resin to a total amount of the resin and the ultra-fine particles; and "1−q" represents that of the ultra-fine particles.

(17) The electroluminescence device according to item 16, wherein refractive index of a resin $n_0$ is not less than 1.5.

(18) The electroluminescence device according to item 16, wherein refractive index of a resin $n_0$ is not less than 1.6.

(19) The electroluminescence device according to item 16, wherein the device further satisfies the following formula:

$$[n_0 \cdot q + n_1 \cdot (1-q)] \geq 1.65 \quad (4)$$

(20) The electroluminescence device according to item 14, further comprising a light-emitting material, wherein at least one of the light-emitting material absorbs light emitted from the emissive layer as excitation light, thereby emitting fluorescence or luminescence.

(21) The electroluminescence device according to any of item 14, wherein the diffusion layer per se constitutes a support substrate.

(22) A planar light source comprising the electroluminescence device according to item 14.

(23) A display comprising the electroluminescence device according to item 14.

DETAILED DESCRIPTION OF THE INVENTION

Figure 1:
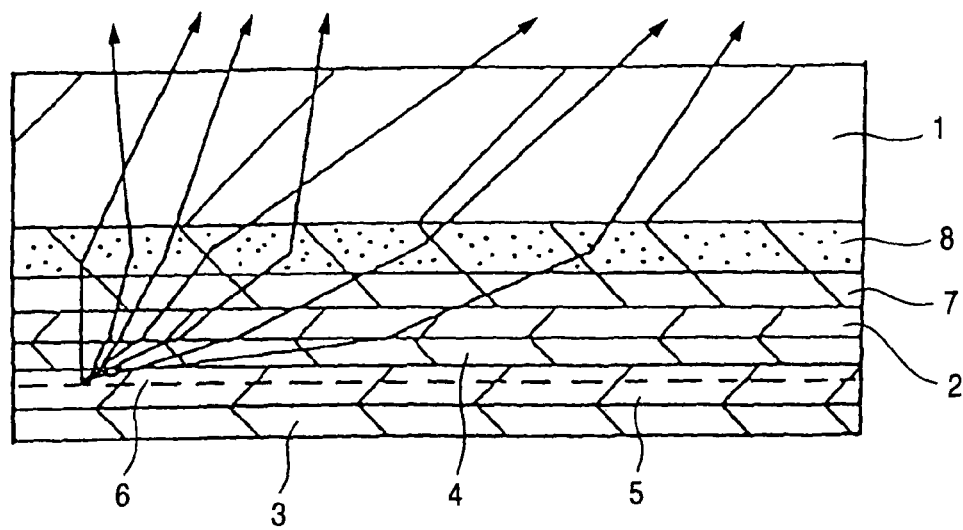
FIG. 1 is a sectional view showing an example of organic EL device according to the first invention.

Description will now be made of modes of carrying out the first invention with reference to drawings. FIG. 1 shows of an example a bi-layer organic EL device of the first invention. It includes a laminate of a transparent electrode 2, a hole transfer layer 4, an electron transfer emissive layer 5 and a reflective electrode 3 on a support substrate 1 in their order as a basic configuration. Thus, an organic layer composed of the hole transfer layer 4 and the electron transfer emissive layer 5 is sandwiched between a pair of electrodes consisting of the transparent and reflective electrodes 2 and 3, and in operation, recombination occurs intensively in a region 6 which is separated from by about 10 nm to the electron transfer emissive layer from an interface between a hole transfer layer 4 and an electron transfer emissive layer 5 which are sandwiched between a reflective electrode 3 and a transparent electrode 2 on a support substrate 1.

In an organic EL device differing from a two-layer one, for example, a three-layer organic EL device composed of a hole transfer layer, a emissive layer and an electron transfer layer, holes are injected from the anode, and electrons from the cathode upon application of a voltage between the electrodes, and they move in their respective carrier transport layers and recombine in the emissive layer to produce excitons, whereby electroluminescence occurs as described above.

In its basic construction as stated above, the organic EL device is preferably so constructed that beams of light confined within the device may be strengthened by one another, while frontally directed beams of light are weakened, whereby the effects of the first invention can be worked more satisfactorily. This aspect will be explained in detail with reference to FIG. 2.

Figure 2:
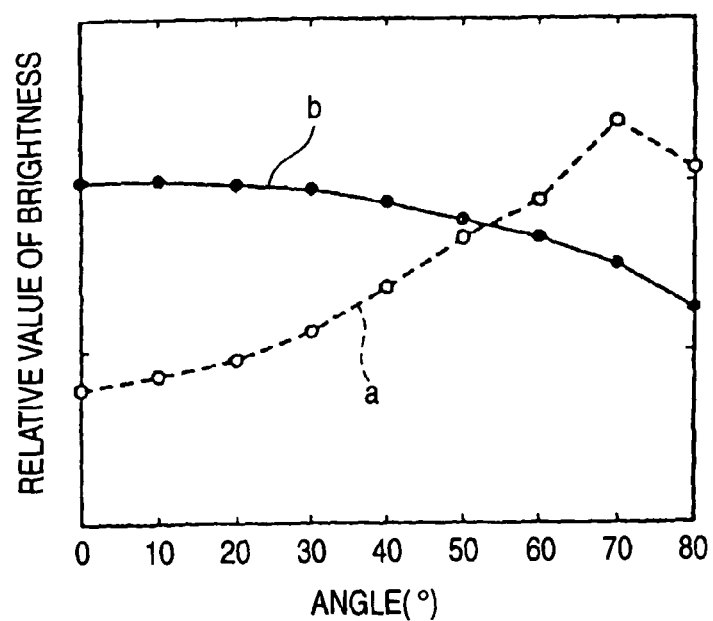
FIG. 2 is a characteristic diagram showing the angle dependence of brightness of each of the organic EL device of the first invention and a conventional one both according to the basic construction.

FIG. 2 is a characteristic diagram showing the angular distribution of luminance of organic EL devices of the basic construction as stated above (i.e., before the formation of a highly refractive layer and a region for disturbing reflection/refraction angle of light as stated later), as measured every 10 degrees from 0 degree of the front to 80 degrees. In the diagram, curve a is for the device according to the first invention and curve b is for a known device.

The transparent electrode 2 in the basic construction had a thickness of 100 nm, the hole transfer layer 4 had a thickness of 50 nm and the electron transfer emissive layer 5 had a thickness of 140 nm (the first invention) or 60 nm (conventional). The measurements were made by applying a voltage so that the same amount of current might flow in both element of the first invention and the known one.

As is obvious from FIG. 2, the known element showed a preferable luminance distribution of the perfectly diffusing type including a high value of frontal luminance as measured at an angle of 0 degree to the front and a substantially equal value of luminance over a relatively wide range. On the other hand, the device of the first invention showed a low value of frontal luminance and an increase in luminance at a wider angle. In other words, the device of the first invention is so constructed as to have an angle dependence of luminance satisfying the formula of formula (1):

Frontal luminance<Luminance at an angle of 50 to 70 degrees (1)

While in the above example, the formula has been realized by a difference in thickness of the electron transfer emissive layer 5 between the two elements, it can also be realized as predetermined by appropriately selecting the materials, thicknesses, etc. of the organic layer including the emissive layer 5 and the pair of electrodes.

A more preferable embodiment of the first invention is so constructed as to satisfying the following formula (2);

$$(0.3/n)\lambda < d < (0.5/n)\lambda \quad (2)$$

wherein d represents the distance between the center of the region 6 and the reflective electrode 3, λ (nm) represents the peak wavelength in the fluorescence emission spectrum of the material used in the emissive layer (in the present case, the electron transfer emissive layer 5), n represents the refractive index of the organic layer between the emissive layer and the reflective electrode 3 (in the present case, the electron transfer emissive layer 5).

It is, for example, preferable that in the above embodiment, the electron transfer emissive layer 5 emit light having a green color with a peak wavelength of 540 nm in its fluorescence emission spectrum, and that when its refractive index is 1.65, the distance d be in the range of 98.2 to 163.6 nm.

Although an example in which the emitted light is green light is described above, an organic EL device which emits white light is actually important for lighting use. Examples of methods for emitting white light includes dispersing, in the emissive layer, a plurality of light emitting materials such as blue and yellow ones or blue, green and red ones, laminating a blue-light-emitting layer, a green-light-emitting layer, a red-light-emitting layer and a yellow-light-emitting layer, or using a material which emits white light by itself.

Similarly to fluorescent lamps, these organic EL devices have a plurality of emission peaks in each wavelength band. In this case, in accordance with the emitted light wavelength and the distance between the recombination region and the reflective electrode, emitted light in the frontally direction may be strengthened or weakened with each other, which considerably varies depending on the wavelength band.

For example, consideration is given to the above-described white-light-emitting organic EL device in which light emitting materials for blue, green and red lights are dispersed in a single emissive layer. Provided that the respective peak wavelengths of blue light, green light and red light are 450 nm, 540 nm, and 630 nm and that the refractive index of the emissive layer is 1.65, the distance d which satisfies the formula (2) differs among the three colors, i.e., 81.8 to 136 nm for blue, 98.2 to 163.6 nm for green, and 114.6 to 190.9 nm for red.

In the first invention, a transparent layer 7 having a refractive index substantially equal to or higher than that of the emissive layer is provided adjacent to a light extracting surface of the transparent electrode 2, and a light diffusion layer as a region 8 for substantially disturbing reflection/scatter angles of light is provided adjacent to a light extracting surface of the transparent layer 7. It is preferable that the configuration of the first invention satisfies the relation of the formula (1), and more preferably that of the formula (2) together. Further, it is preferable to use the light diffusion layer being formed by dispersing, in a transparent layer similar to the above as a matrix, diffusion particles having a refractive index different from that of the transparent layer as the region 8. With such an arrangement, total reflection does not occur at the interface between the transparent layer 7 and the transparent electrode 2, and all the light emitted is subjected to scattering at the light diffusion layer 8. Thus, the possibility that the guided waves are emitted to the outside is increased, whereby the emission brightness is greatly increased.

In the first invention, as to the transparent layer 7, the refractive index which is substantially equal to or more than that of the emissive layer means a refractive index which is not less than 0.95 times as large as that of the emissive layer, preferably not less than that of the emissive layer, and more preferably not less than 1.05 times as large as that of the emissive layer.

From FIG. 1, it may seem that all the light passed through the light diffusion layer 8 is extracted to the outside. Actually, however, a part of the light passed through the light diffusion layer 8 is also totally reflected at the interface of the base substrate 1 and confined. However, the light totally reflected at the interface between the base substrate 1 and the air layer repeats the reflection at the reflective electrode 3 and the travels through the light diffusion layer 8 to be finally extracted to the outside.

Figure 3:
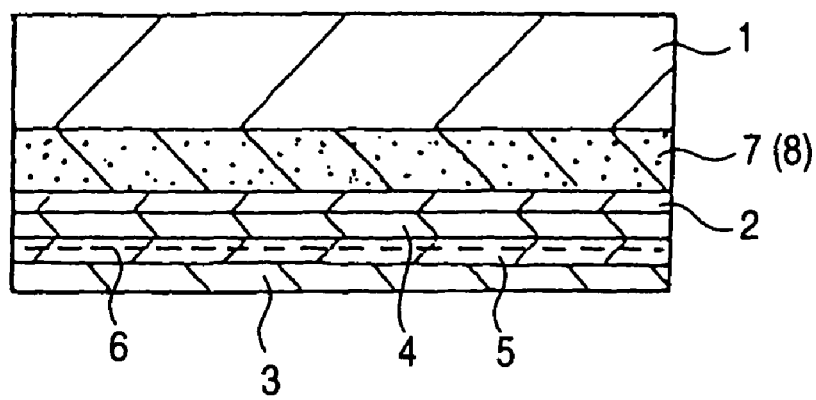
FIG. 3 is a sectional view showing another example of organic EL device according to the first invention.
Figure 4:
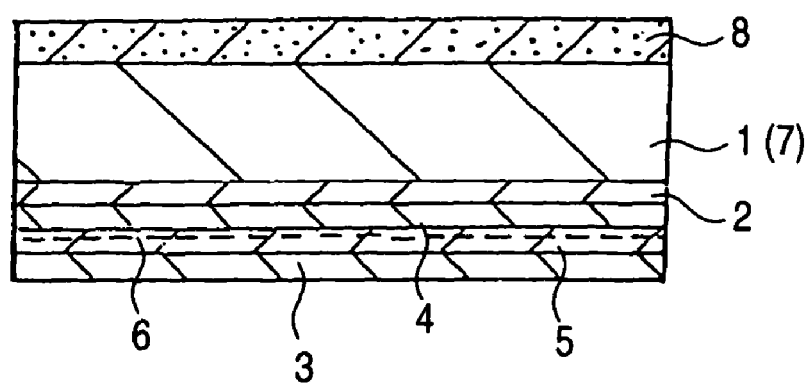
FIG. 4 is a sectional view showing still another example of organic EL device according to the first invention.

Although the region 8 disturbing the reflecting/scattering angle of light is formed adjacent to the light-emitting surface of the transparent layer 7 according to the construction shown in FIG. 1, it may alternatively be formed within the transparent layer 7 as a part or the whole thereof, as shown in FIG. 3. In other words, the transparent layer 7 per se may be formed by the light-diffusion layer 8. Moreover, it is possible to employ a support substrate 1 formed from a transparent material as a transparent layer 7, as shown in FIG. 4. Although FIG. 4 shows a light-diffusion layer 8 formed as described above adjacent to the light-emitting surface of the support substrate 1 serving also as the transparent layer 7, the light-diffusion layer 8 can be replaced by a micro-lens array or physical prismatic structure formed on the light-emitting surface of the support substrate 1 serving also as the transparent layer 7, as shown in FIG. 5.

Figure 5:
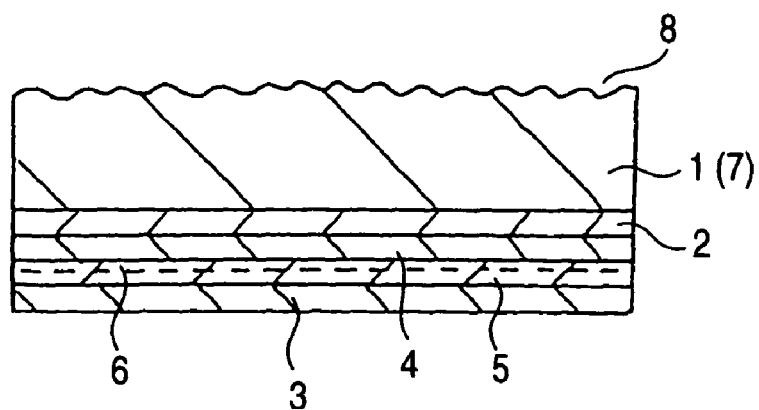
FIG. 5 is a sectional view showing still another example of organic EL device according to the first invention.

The other structural elements of FIGS. 3 to 5 are identical to those of FIG. 1 and denoted by the same reference number as in FIG. 1, and no detailed description thereof is made.

Figure 6:
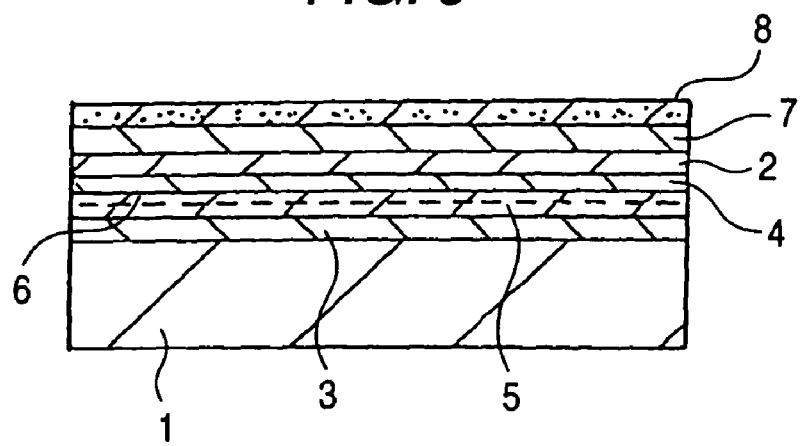
FIG. 6 is a sectional view showing a further example of organic EL device according to the first invention.

The organic EL device of the first invention may alternatively comprise a top-emission type organic EL device made by forming a reflective electrode 3, an electron transfer emissive layer 5, a hole transfer layer 4 and a transparent electrode 2 in their order on a support substrate 1 and further forming a transparent layer 7 and a light-diffusion layer 8 in their order thereon, and adapted to emit light from the opposite side of the support substrate 1, as shown in FIG. 6. The support substrate 1 does not necessarily need to be transparent.

The first invention is also applicable to an organic EL device of a both-side-extraction type in which both electrodes comprise transparent electrodes instead of providing the reflective electrode. In this case, the transparent layer and the light diffusion layer are formed on both of the transparent electrodes, whereby the light emission strength can be enhanced on both surface sides. In the case of such an organic EL device of a both-side-extraction type which is not provided with a reflective electrode, the formula (1) and the formula (2) need not necessarily be satisfied.

The organic EL device of the first invention can also be of various forms other than those shown above if it is so constructed as to include a transparent layer 7 formed adjacent to the light-emitting surface of a transparent electrode 2 and a region 8 formed adjacent to the light-emitting surface of the transparent layer 7 or within the transparent layer 7 for disturbing the reflecting/scattering angle of light substantially. A layer intended for achieving surface smoothness or tight adhesion, preventing the diffusion of residual impurities, improving gas barrier property, etc. may be formed between the transparent electrode 2 and the transparent layer 7. This layer is, however, required to form a transparent layer; too, so that it is possible to form two or more transparent layers having different functions as stated.

Hereinafter, configurations and effects of an organic EL device of the second invention will be described in comparison with those of an conventional organic EL device configured.

Figure 17:
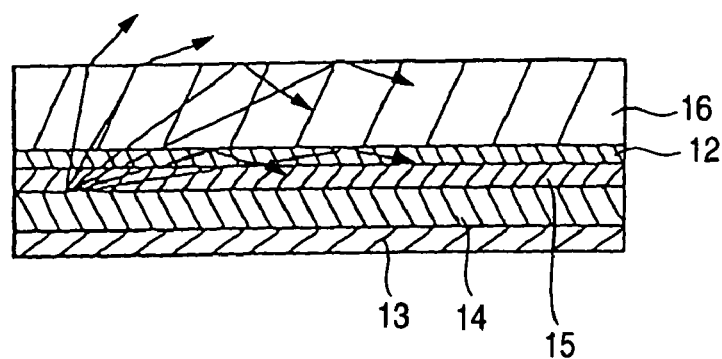
FIG. 17 is a sectional view showing a conventional organic EL element.

FIG. 17 shows an organic EL device having a conventional configuration. In the organic EL device, there is provided an organic EL layer in which a pair of electrodes are configured from an anode 12, which is a transparent electrode supported on a support substrate 16 of a glass substrate; a cathode 13, which is a reflective electrode; and an electron transport emissive layer 14 and a hole transport layer 15 sandwiched between the electrodes 12 and 13.

The drawing shows a schematic diagram of only an upper hemispherical side of a case where emitted light from a light-emitting region is caused to exit to the outside. In actually, light is also emitted in the direction for the reflective electrode; however, the light is not depicted in the drawing.

As described above, light radiated in all directions initially undergoes total reflection at the interface between the transparent electrode and the glass substrate, and is confined inside the device. A calculation based on classical theory indicates that loss at the interface between the transparent electrode and the glass substrate corresponds to approximately 45% of the total emitted light. Furthermore, light transmitted to the glass substrate undergoes total reflection at the interface between the glass substrate and the air, to thereby be confined inside. A calculation similar to the above indicates that loss at the interface between the glass substrate and the air corresponds to approximately 35% of the total emitted light. Consequently, light which actually exits to the outside and reaches an observer totals only 20%.

Figure 18:
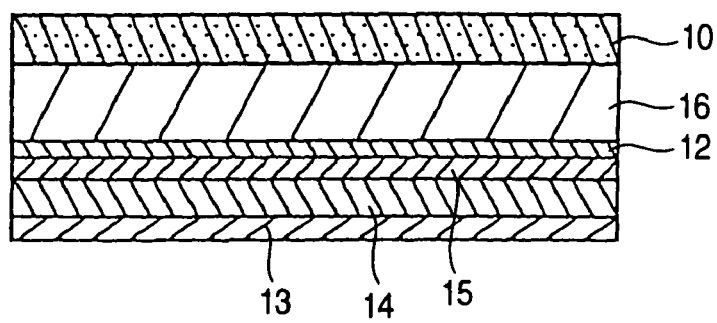
FIG. 18 is a sectional view showing an organic EL element different from that of the present invention.

With regard to the organic EL device, for instance, there may be adopted a method of forming a light diffusion layer 10 on the glass substrate as a region for causing variation in the reflection/refraction angle of light, as shown in FIG. 18. Because light under a condition of total reflection is diffused, some of the light which is supposed to undergo total reflection at the air/glass interface can be guided to the outside. However, the above method can guide to the outside only the light which is supposed to undergo total reflection at the air/glass interface, and has no effects on the light which undergoes total reflection at the glass substrate/transparent electrode interface.

To this end, in the present invention, a diffusion layer, in which are dispersed at least two kinds of fine particles whose mean particle sizes differ from each other by such that the particle size of larger fine particles are at least ten times as large as that of smaller fine particles, is disposed adjacent to a transparent electrode of high refractive index. Consequently, ultra-fine particles of extremely small mean particle size enhance the refractive index of the diffusion layer, and fine particle whose mean particle size is larger than that of the ultra-fine particles allow diffusion of light. As a result, light which is supposed to undergo total reflection at the interface between the glass substrate and transparent electrode can also be guided to the outside. Accordingly, when configured as described above, the EL device can guide to the outside light corresponding approximately to 80% of the total light.

Figure 12:
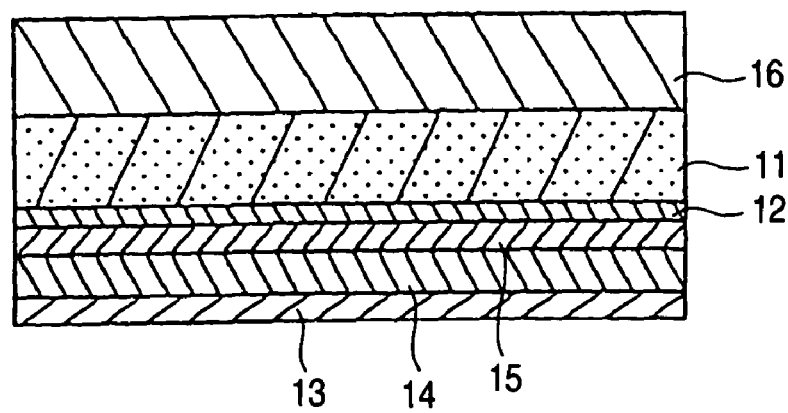
FIG. 12 is a sectional view showing a first embodiment of an organic EL element of the second invention.

FIG. 12 shows the most basic embodiment of the second invention.

As is the aforementioned case shown in FIG. 17, in the organic EL device, there is provided an organic EL layer including a pair of electrodes configured from the anode 12 of a transparent electrode supported on the support substrate 16 of a glass substrate, and the cathode 13 of a reflective electrode; and the electron transport emissive layer 14 and the hole transport layer 15, which are sandwiched between the electrodes 12 and 13. In the organic EL device, a diffusion layer, which contains at least two kinds of fine particles which differ in mean particle size such that the particle size of larger fine particles are at least ten times as large as that of smaller fine particles, is disposed adjacent to the anode 12, which is an electrode (transparent electrode) disposed on the light extraction surface.

Particularly, the at least two kinds of the fine particles in the above-mentioned light diffusion layer 11 are preferably constituted of ultra-fine particles having a mean particle size of 1 to 100 nm, and fine particles having a mean particle size more than 0.1 μm and not more than 50 μm.

Furthermore, in the light diffusion layer 11, it is preferable to satisfying the following formulas:

$$n_1 \geq 1.9$$

$$|[n_0 \cdot q + n_1 \cdot (1-q)] - n_2| \geq 0.05 \quad (3)$$

wherein $n_0$ represents the refractive index of a resin; $n_1$ denotes that of the ultra-fine particles dispersed in the resin and whose mean particle size is 1 to 10 nm; $n_2$ denotes that of the fine particles dispersed in the resin and whose particles size is more than 0.1 μm and not more than 50 μm; "q" represents a volume fraction of the resin to a total amount of the resin and the ultra-fine particles; and "1−q" represents that of the ultra-fine particles. Furthermore, in such a light diffusion layer 11 as described above, the refractive index $n_0$ of the resin preferably satisfies $n_0 \geq 1.5$, more preferably $n_0 \geq 1.6$. Further, it is more preferable to satisfy the following formula (4):

$$[n_0 \cdot q + n_1 \cdot (1-q)] \geq 1.65 \quad (4)$$

When the organic EL device is configured as described above, in the case where the diffusion layer 11 whose apparent refractive index has been improved has a refractive index equal to that of the anode 12, which is the transparent electrode, radiated light is transmitted into the diffusion layer 11 without undergoing total reflection at the interface between the diffusion layer 11 and the anode 12. Thereafter, the light is scattered at the light diffusing portion formed by dispersing fine particles, thereby increasing a ratio of waveguide light that exits to the outside. Consequently, luminance is increased.

Figure 13:
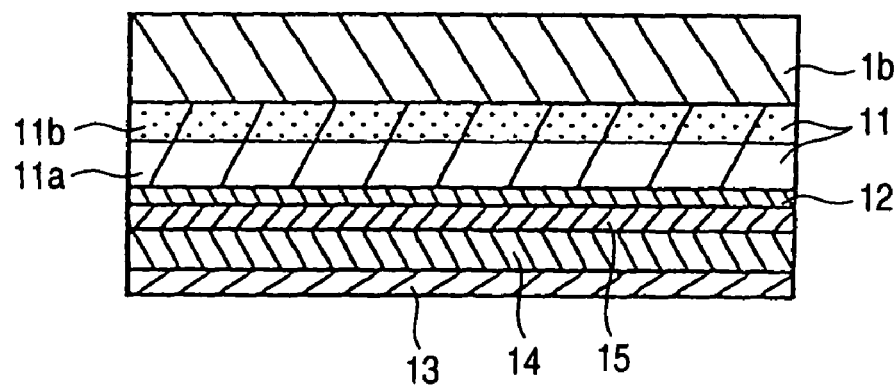
FIG. 13 is a sectional view showing a second embodiment of an organic EL element of the second invention.
Figure 14:
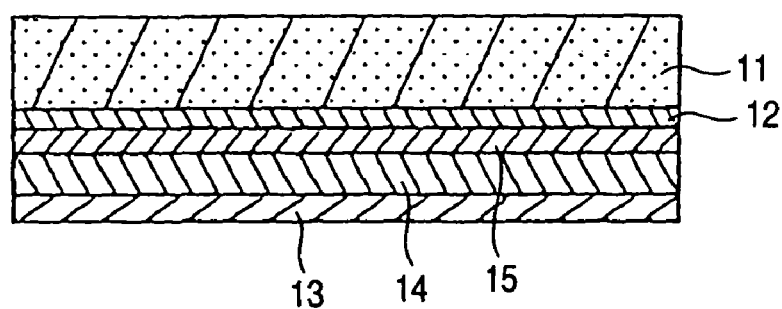
FIG. 14 is a sectional view showing a third embodiment of an organic EL element of the second invention.
Figure 15:
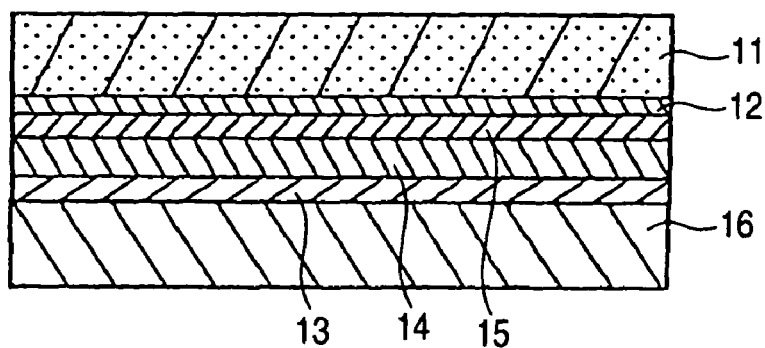
FIG. 15 is a sectional view showing a fourth embodiment of an organic EL element of the second invention.

FIGS. 13 to 15 respectively show alternative embodiments of the invention.

First, FIG. 13 shows that the diffusion layer 11 of the organic EL device shown in FIG. 12 is configured from two layers 11a and 11b. In the layer 11a, only ultra-fine particles for improving the refractive index are dispersed. In the layer 11b, the ultra-fine particles for improving the refractive index and fine particles having larger particle size for forming light diffusing portions are dispersed. Other components shown in FIG. 13 are identical with those shown in FIG. 12. The other components are denoted by the same reference numbers as those used in FIG. 12, and repeated descriptions are omitted.

FIG. 14 shows an organic EL device whose diffusion layer 11 per se constitutes a support substrate, thereby obviating the glass substrate 16 shown in FIG. 12. Other components are identical with those of FIG. 12. Such components are denoted by the same reference numbers with those used in FIG. 12, and repeated descriptions are omitted.

FIG. 15 shows another embodiment wherein a so-called upper surface extraction method in which another material is employed for the support substrate 16, thereby allowing extraction of emitted light from the opposite side to the substrate 16. In this case, the support substrate 16 is not necessarily transparent. Other components are identical with those shown in FIG. 12. Such components are denoted by the same reference numerals as those used in FIG. 12, and repeated descriptions are omitted.

The embodiments illustrated in FIGS. 1 to 4 are only some of examples of the EL device of the second invention, and the configuration of the invention is not limited thereto.

In the second invention, essential requirements are that: a diffusion layer is disposed adjacent to a transparent electrode on the light extraction surface side; and at least two kinds of fine particles (ultra-fine particles serving for improvement of the refractive index and fine particles serving for diffusion of light) which differ in mean particle size such that the particle size of larger fine particles are at least ten times as large as that of smaller fine particles are dispersed in the diffusion layer. So long as these requirements are satisfied, other configurations are completely arbitrary.

Furthermore, another layer may be formed between the transparent electrode made from ITO, or the like, and the diffusion layer for the purpose of improved surface smoothness, improved adherence, preventing diffusion of remaining impurities, improved gas-barrier property, or the like. However, the refractive index of the thus-inserted layer is preferably close to that of the diffusion layer.

There is no specific limitation to the organic material, electrode material, or layer combination or thickness for the basic configuration for the organic EL device of this first and second invention. The organic layer may be formed without any particular limitation from a low molecular material by vacuum deposition, or from a high molecular material by coating or otherwise.

More specifically, it is possible to select without any particular limitation any of various combinations. Examples of the combinations include; an above-mentioned two-layer organic EL device of anode/hole transfer layer/electron transfer emissive layer/cathode for, a three-layer organic EL device of anode/hole transfer layer/emissive layer/electron transfer layer/cathode, and other laminated device of anode/light-emitting layer/cathode.

It is also possible to form a hole injection layer at the anode interface, an electron injection layer at the cathode interface, or an electron or hole blocking layer for achieving an improved recombination efficiency. What is basically important is to select a combination, materials and forming methods which make it possible to realize a higher light-emitting efficiency to obtain electroluminescence of higher intensity with a lower power consumption and thereby derive a greater advantage from this invention.

The materials for the electrodes can also be selected properly. A transparent conductive film such as indium tin oxide (ITO), antimony-doped tin oxide, zinc oxide is used for the anode. Such a transparent conductive film has a refractive index of about not less than 1.9 and makes it possible to derive the advantages of the invention. An electrode formed by co-deposition of Mg and Ag in an atomic ratio of about 10:1, a Ca electrode or an Al electrode doped with a small amount of Li is, for example, used as the cathode preferably for an improved electron injection efficiency by a reduced work function, though there is no such limitation.

A common substrate can be used as the support substrate for the first and second invention irrespective of its transparency. A glass substrate may be used to emit light therefrom through a transparent electrode, or an opaque metal plate may be used as the support substrate so that light may be emitted from the opposite side of the device from the substrate, as shown in FIG. 6 or 15.

While the anode can be a transparent electrode, the cathode can alternatively be a transparent electrode if, for example, a metal electrode is formed on the organic layer interface with a thickness of several to tens of nanometers permitting transmission of light, whereafter ITO is formed thereon. A flexible material, such as a polymer film, may be used for the support substrate, or as already stated, the support substrate per se may compose a transparent layer or a diffusion layer as shown in FIG. 4 or 14. In the first invention, the support substrate per se may form a region for disturbing reflection/refraction angle of light.

In the second invention, in the case where the diffusion layer per se is used also as the support substrate, from the viewpoint of prolongation of the life of the device, the diffusion layer is preferably employed after being dried for degassing and dehydration.

Figure 16:
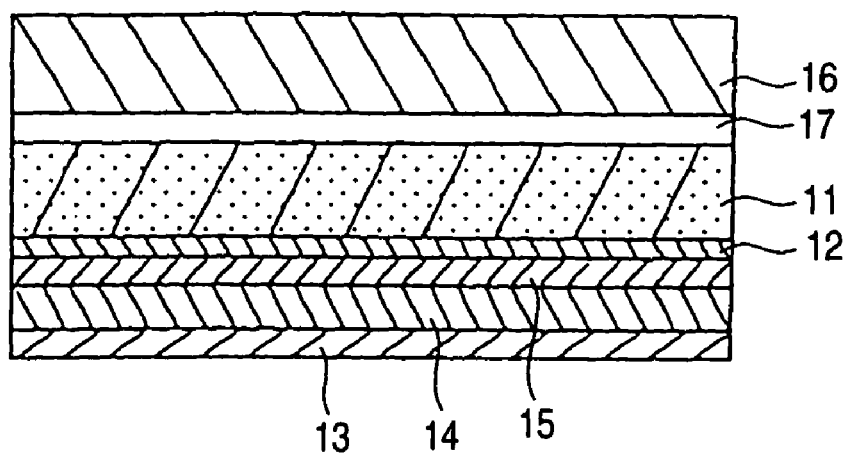
FIG. 16 is a sectional view showing a fifth embodiment of an organic EL element of the second invention

Additionally, a layer whose refractive index is lower than that of the support substrate may be inserted between the support substrate and the diffusion layer in the second invention. For instance, as shown in FIG. 16, an air layer 17 may be inserted. Meanwhile, other components shown in FIG. 16 are identical with those shown in FIG. 12. Such components are denoted by the same reference numbers as those used in FIG. 12, and repeated descriptions are omitted.

Materials used in each of the first and second inventions are illustrated in detail as follows.

<First Invention>

Any organic or inorganic material is suitable as the material for the transparent layer for the first invention if it has a refractive index equal to or more than that of the emissive layer.

The advantages of the first invention can be obtained to some extent by using a material having a refractive index of not less than 0.95 times as large as that of the emissive layer, examples of which include high refractive index glass containing a sulfur atom, polyethylene terephthalate resin and polyethersulfone resin. It is preferable to use a material having a refractive index of not less than 1.7, more preferably not less than 1.8, further more preferably not less than 1.9. In view of workability, a resin material is preferable.

However, properties other than the refractive index, i.e., moldability, heat resistance, thermal expansion coefficient, moisture resistance, adhesion to the transparent electrode and transparency, for example, are also important, and there are many materials which are satisfactory in terms of these properties but have a refractive index which does not satisfy the requirement of the first invention. Further, to maximize the advantages of the first invention, it is preferable that the refractive index is not less than 1.05 times that of the emissive layer. From these points of view, it is preferable to further increase the refractive index by adding, to the transparent layer, particles having a refractive index which is higher than that of the transparent layer and a particle size which is smaller than the wavelength of light. Conversely, particles having a low refractive index may be dispersed for refractive index adjustment.

Fine particles used for such purposes may, for example, be of metal oxides, such as $TiO_2$, $ZrO_2$, $ZnO$, $Y_2O_3$, $SnO_2$, $CdO$, $PbO$, $SiO_2$, $Sb_2O_5$, $Al_2O_3$, $CeO_2$, $In_2O_3$, $HfO_2$, $In_2O_3$ doped with $SnO_2$ and $SbO_2$ doped with $Sb_2O_5$ sulfides such as ZnS, selenides or tellurides, and are not particularly limited. The fine particles may or may not be spherical, and may be widely variable in shape unless they cause scattering of visible light.

It is necessary for the fine particles to have a diameter sufficiently smaller than the wavelength of visible light not to cause scattering of light in the visible range. The fine particles preferably have an average particle size of 1 to 100 nm, more preferably 1 to 50 nm.

The fine particles may be added in any amount as desired, but preferably in the amount of 10 to 500 parts by weight to 100 parts by weight of resin. A refractive index controlled in a certain range as desired can be obtained by using fine particles having a different refractive index or adding a different amount of fine particles.

Any method can be employed for preparing the fine particles without limitation and any surface treatment or modification may be given to the fine particles for improving their dispersibility.

As described above, the refractive index of the transparent layer of the first invention is not less than 0.95 times as large as that of the emissive layer, preferably not less than that of the emissive layer, and more preferably not less than 1.05 times as large as that of the emissive layer. Specifically, the refractive index of the transparent layer is preferably not less than 1.7, more preferably not less than 1.8, further more preferably not less than 1.9. The refractive index of the emissive layer varies depending on the molecular structure, and a relatively high one exceeds 1.75. In such a case, since the refractive index of a typical resin material is not more than 1.7, such particles as described above need be added by a large amount to sufficiently increase the refractive index.

In the first invention, when a light diffusion layer is to be formed, diffusion particles for scattering light need to be added in addition to the particles for increasing the refractive index. Further, in the case where a lens structure or an irregular structure is to be formed, there is a fear that the properties of the resin per se such as workability or strength may be deteriorated when the proportion of the particles is increased too much. Therefore, as the resin to constitute the matrix, a material with a higher refractive index is more preferable, and a material whose refractive index is higher, by itself, than that of the emissive layer is suitable. However, the refractive index of a typical resin is generally about 1.49 to 1.65, and a resin which can be suitably used, by itself, for the first invention is rarely found except for peculiar ones such as a resin containing a sulfur atom, which is used for plastic lenses of eyeglasses.

The present inventors have discovered that a polycarbodiimide resin represented by following formula (I) is preferred as such a transparent material:

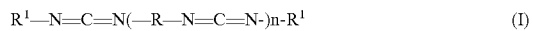

$$R^1—N=C=N(—R—N=C=N-)_n-R^1 \quad (I)$$

wherein R represents a organic diisocyanate residue, $R^1$ represents a organic monoisocyanate residue, and n represents an integer of 1 to 100.

In formula (I), examples of the organic diisocyanate residue (R) include a tolylenediisocyanate residue, diphenylmethanediisocyanate residue, naphthalenediisocyanate residue, hexamethylenediisocyanate residue or dodecamethylenediisocyanate residue, these residues can be used either individually or as a combination of two or more thereof. It is preferable for the naphthalenediisocyanate residue to occupy 10 mol % or more in total organic diisocyanate residue. A 1-naphthylisocyanate residue is preferable as the organic monoisocyanate residue ($R^1$).

A polycarbodiimide resin can be obtained by using several kinds of organic diisocyanates, subjecting them to under a carbodiimidizing reaction at preferably 0° C. to 150° C., more prefereably 10° C. to 120° C. in the presence of a carbodiimidizing catalyst and a solvent and hindering the terminals of the reaction product with an organic monoisocyanate. The terminal-hindered polycarbodiimide resin has a high stability for storage as a solution.

The hindering of the terminals with an organic monoisocyanate can be carried out by adding an organic monoisocyanate to the reaction system during the final, middle or initial stage of the polymerization reaction, or throughout all such stages. The end point of the reaction can be ascertained by the observation of an IR absorption (2,140 $cm^{-1}$) attributable to the carbodiimide group and the disappearance of an IR absorption (2,280 $cm^{-1}$) attributable to the isocyanate group.

Examples of the organic diisocyanates are one or more of hexamethylenediisocyanate, dodecamethylenediisocyanate, 2,2,4-trimethylhexamethylene diisocyanate, 4,4'-dicyclohexylmethanediisocyanate, xylylenediisocyanate, tetramethylxylylenediisocyanate, isophoronediisocyanate, cyclohexyldiisocyanate, lysinediisocyanate, methylcyclohexane-2,4-diisocyanate, 4,4'-diphenylmethanediisocyanate, 4,4'-diphenyletherdiisocyanate, 2,6-tolylenedioscyanate, 2,4-tolylene iisocyanate, naphthalenediisocyanate, 1-methoxyphenyl-2,4-diisocyanate, 3,3'-dimethyoxy-4,4'-diphenylmethanediisocyanate, 4,4'-diphenyletherdiisocyanate, 3,3'-dimethyl-4,4'-diphenyletherdiisocyanate and 2,2-bis[4-(4-isocyanatephenoxy)phenyl]propane. It is particularly desirable to use not less than 10 mol % of naphthalene diisocyanate. Other preferred examples are tolylenediisocyanate, 4,4'-diphenylmethanediisocyanate, hexamethylenediisocyanate and dodecamethylenediisocyanate.

Preferred examples of the organic monoisocyanates are one or more of aromatic monoisocyanates, such as phenylisocyanate, p-nitrophenylisocyanate, p- or m-tolylisocyanate, p-formylphenylisocyanate, p-isopropylphenylisocyanate and 1-nephthyl socyanate. It is preferable to use 1-nephthylisocyanate, since there is no reaction between monoisocyanates, but the hindering of the terminals of the polycarbodiimide is allowed to proceed efficiently.

The organic monoisocyanate is preferably used in a proportion of 1 to 10 mols for 100 mols of organic diisocyanate. The use of less than 1 mol is likely to result in a polycarbodiimide resin solution having a low stability for storage because of too high a molecular weight of the resin, or an increase in the viscosity of the solution or its solidification by a crosslinking reaction. The use of over 10 mols results in a polycarbodiimide resin solution having too low a viscosity to form a film easily by coating and drying.

When aliphatic and aromatic disocyanates are used as the organic diisocyanates and reacted with each other in the presence of a cabodiimidizing catalyst, their reaction at a low temperature is preferred. Specifically, the reaction temperature is preferably 0° C. to 50° C., and more preferably 10° C. to 40° C. If the reaction temperature is higher than 50° C., the reaction of aromatic diisocyantes proceeds with priority and the reaction of aliphatic and aromatic disocyanates does not proceed satisfactorily.

When the polyacrbodiimide resin obtained by the polymerization reaction as described is further reacted with the excess of aromatic diisocyanate existing in the reaction system, the reaction temperature is preferably 40° C. to 150° C., and more preferably 50° C. to 120° C. If the reaction temperature is less than 40° C., the reaction unpractically takes a long time and if it exceeds 150° C., the reaction solvent is difficult to choose.

The reaction solvent and an organic solvent used for diluting the polycarbodiimide resin as obtained may be selected from the known ones.

Specifically, it is possible to mention halogenated hydrocarbons such as tetrachloroethylene, 1,2-dichloroethane and chloroform, solvents of the ketone series such as acetone, methyl ethyl ketone, methyl isobutyl ketone and cyclohexanone, cyclic ether solvents such as tetrahydrofuran and dioxane, aromatic hydrocarbon solvents such as toluene and xylene, etc. These organic solvents can be used either individually or as a combination of two or more thereof.

The concentration of the organic diisocyanate in the reaction system is preferably 5 to 80% by weight. If it is lower than 5% by weight, the carbodiimidizing reaction sometimes fails to proceed, and if it exceeds 80% by weight, the reaction is sometimes difficult to control.

Any known phosphorus-based catalyst is suitable for use as the carbodiimidizing catalyst. Specifically, it is possible to mention phospholene oxides, such as 1-phenyl-2-phospholene-1-oxide, 3-methyl-2-phospholene-1-oxide, 1-ethyl-2-phospholene-1-oxide and 3-methyl-1-phenyl-2-phospholene-1-oxide and 3-phospholene isomers thereof.

After the end of the carbodiimidizing reaction, the reaction product may be poured into a poor solvent, such as methanol, ethanol, isopropyl alcohol or hexane, so that a polycarbodiimide resin may settle down and be precipitated, while the unreacted monomers and the catalyst are removed. A solution of the polycarbodiimide resin may be prepared by employing a given process for washing the precipitated polymer, drying it and dissolving it in an organic solvent again. This process makes it possible to improve the stability of the polycarbodiimide resin in solution.

The solution of the polycarbodiimide resin may be refined by having a suitable adsorbent, etc. adsorb any by-product that it contains. It is possible to use as the adsorbent alumina gel, silica gel, activated carbon, zeolite, activated magnesium oxide, activated bauxite, Fuller's earth, activated white clay, molecular sieve carbon, etc. alone or as a mixture.

The polycarbodiimide resin thus obtained has a very high refractive index and can be used as a material for a transparent layer as it is. It is also possible to add fine particles to the polycarbodiimide resin as stated before to form a highly refractive layer having a refractive index nearly equal to that of a transparent electrode without impairing the characteristics of the resin itself, so that the advantage of the first invention may be manifested more effectively.

There is no particular limitation as to the method of forming the region for disturbing reflection/refraction angle of light according to the first invention, but it is basically sufficient for the region to be so formed that an angle of light transmission equal to, or larger than the angle of total internal reflection can be disturbed into an angle of transmission equal to, or smaller than the angle of total internal reflection, and that as much waveguide light confined within the device as possible can be emitted externally. Any hitherto proposed method is applicable as it is.

For example, a light-diffusing site may be formed as the light-diffusion layer by dispersing and distributing in a transparent material another transparent material having a different refractive index therefrom, or an opaque material. More specifically, it is possible to mention, for example, one obtained by dispersing and distributing silica, titania, zirconia, plastics or liquid crystal particles, or air bubbles in the polycarbodiimide resin which is a highly refractive material.

Although there is no particular limitation as to the refractive index of any such material, the difference in refractive index between those materials or the diameter of those particles, it is preferable from a standpoint of light scattering for the particle size to be from 0.2 to 20 μm, more preferably from 0.3 to 10 μm and still more preferably from 0.5 to 5 μm, and for the difference in refractive index to be not less than 0.05.

A lens structure is also suitable for use. The lens structure means a thin sheet-like transparent substance for changing the direction of straightly moving light by a plurality of lenses, prisms, V-shaped grooves, etc. arranged or formed in concentric circles, parallel lines, a grid, etc. Specific examples are a lenticular lens, a Fresnel lens, a cube corner lens, a fly's eye lens, a cat's eye lens, a double fly's eye lens, a double lenticular lens, a radial lenticular lens, a prism lens or a micro-prism lens, or a lens obtained by changing the convex surface of any such lens into a concave surface, or a planar array of transparent or semi-transparent spheres. It is also possible to form grooves, such as V-shape grooves, for changing the direction of light.

Further, a physically irregular surface may be formed on the support substrate or each of the interfaces. Specifically, such an irregular surface can be formed by transferring a periodic irregular structure. It is preferable that the size of the irregular surface is larger than the wavelength of light, and specifically, the surface roughness of not less than 1 μm is preferable. When the irregular surface is smaller than that, the angle of reflection/transmission of light cannot be disturbed efficiently, and such a problem as the generation of rainbow-colored glare due to the interference effect of light may be caused.

According to the first invention, it is possible to provide a planar light source having as a light-emitting device the organic EL device constructed as described, and also a display device having the organic EL device described above as a light-emitting device. Accordingly, it is possible to provide a planar light source and a display device both having a high light-emitting efficiency.

<Second Invention>

No particular limitation is imposed on a resin employed for the diffusion layer of the second invention; however, the refractive index $n_0$ of the resin is preferably not less than 1.5, more preferably not less than 1.6, and further preferably not less than 1.65.

Specific examples of the resin employed for the diffusion layer include: thermosetting resins, such as a phenol resin, a urea resin, an imide or polyimide resin, a melanine resin, unsaturated polyester, a diallylphthalate resin, a xylene resin, an alkylbenzene resin, an epoxy resin, an epoxyacrylate resin, or a silicone resin; thermoplastic resins, such as a fluoroesin, a polyvinylchroride resin, a polyvinylidenechloride resin, polyethylene, chlorinatedpolyolefin, polypropylene, modified polyolefin, polyvinylacetate, ethylene-ethylacrylate copolymer, polystyrene, an ABS resin, polyamide, a (meth)acrylic resin, polyacetal, polycarbonate, cellulose resins, or polyvinyl alcohol; engineering plastics, such as polyimide, polycarbodiimide, an ionomer resin, polyphenilene, polyphenylene oxide, polymethylpentene, polyallylsulfone, polyallylether, polyphenylene sulfide, polysulfone, polyethyleneterephthalate, polybutyleneterephthalate, or polytetramethyleneterephthalate; and radiation curing resins, such as UV curing resin or electron radiation curing resins.

However, a general resin material, even a highly refractive one, has a refractive index of around 1.65. Therefore, in the second invention, the refractive index is further enhanced by means of addition of ultra-fine particles having a refractive index greater than that of the resin. More specifically, the refractive index $n_1$ of the ultra-fine particles which are to be added for the above purpose is preferably not less than 1.9, and more preferably not less than 2.5.

Examples of the ultra-fine particles to be added includes: metal oxides, such as $TiO_2$, $ZrO_2$, ZnO, $Y_2O_3$, $SnO_2$, CdO, PbO, $SiO_2$, $Sb_2O_5$, $Al_2O_3$, $CeO_2$, $In_2O_3$, $HfO_2$, and $In_2O_3$ respectively doped with $SnO_2$; or $SbO_2$ doped with $Sb_2O_5$. Other than the above, sulfides, such as ZnS; selenide; or telluride may also be employed as the ultra-fine particles to be added, and no particular limitation is imposed thereon. For the purpose of adjusting the refractive index, fine particles of lower refractive index may be used in combination with the high-refractive-index fine particles.

An essential requirement for such ultra-fine particles as described above is that the particle size is sufficiently smaller than the wavelength of visible light, so that light scattering does not occur in the visible light region. Accordingly, the mean particle size is preferably 1 to 100 nm. More preferably, in order to totally prevent light scattering, the mean particle size is 1 to 50 nm. The particles may be or may not be completely spherical; the specific shape does not matter and is applicable without posing any particular problem, so long as the ultra-fine particles do not cause scattering in the visible light region.

A manufacturing method for Such ultra-fine particles is completely arbitrary, and no particular limitation is imposed thereon. Some kind of surface treatment or surface modification may be applied for the purpose of improving dispersibility of the ultra-fine particles, and no particular limitation is imposed thereon.

Furthermore, the addition amount of the ultra-fine particles is also arbitrary. There is usually preferred addition of the ultra-fine particles within a range of 10 to 500 parts by weight per 100 parts of weight of resin. The refractive index of the diffusion layer can be controlled to a desired value within a certain range by means of varying the refractive index of the ultra-fine particles or the addition amount thereof.

The refractive index of the diffusion layer of the second invention is preferably equal to or more than that of the emissive layer, more preferably not less than 1.65, and further preferably not less than 1.7. That is, it is preferable to satisfy the following formula (4):

$$[n_0 \cdot q + n_1 \cdot (1-q)] \geq 1.65 \quad (4)$$

wherein "q" represents a volume fraction of the resin to a total amount of the resin and the ultra-fine particles, and "1−q" denotes that of the ultra-fine particles. It is more preferable that the value of $[n_0 \cdot q + n_1 \cdot (1-q)]$ is 1.7 or more.

In the second invention, diffusing portions for causing light scattering are formed in the diffusion layer by means of dispersing fine particles whose mean particle size is at least ten times as large as that of the above-mentioned ultra-fine particles. The mean particle size of the fine particles is preferably more than 0.1 μm and not more than 50 μm, more preferably 0.3 to 30 μm, and still more preferably 0.5 to 10 μm. It is preferable that the refractive index $n_2$ of such fine particles the following formula (3):

$$|[n_0 \cdot q + n_1 \cdot (1-q)] - n_2| \geq 0.05 \quad (3)$$

Examples of such fine particles include those in which silica particles, alumina particles, silicone particles, titania particles, zirconia particles, plastic particles, liquid crystal particles, or air bubbles are distributed in a dispersed manner. These particles can be used either individually or as a combination of two or more thereof. Furthermore, the above-mentioned ultra-fine particles used for the purpose of enhancing the refractive index may also be employed as fine particles for the purpose of diffusing light by means of controlling the dispersion method or addition amount, thereby aggregating a portion of ultra-fine particles and increasing the particle size of the ultra-fine particles.

Light-emitting material may be added in the diffusion layer of the second invention. The light-emitting material is preferably dispersed in arbitrary areas of the diffusion layer. The light-emitting material is preferably soluble, because scattering caused by the light-emitting material is not preferable. In the case where the light-emitting material is present in a dispersed manner, the sizes of areas where the light-emitting material is diffused are preferably as small as possible, from the viewpoint of suppressing unnecessary scattering.

The light-emitting material may be dissolved or dispersed according to an appropriate method, such that the light-emitting material is blended in advance into material, for forming a translucent resin or a micro region, in conjunction with the other additives, as required.

No particular limitation is imposed on the light-emitting material, so long as the light-emitting material absorbs ultra-violet or visible light, to thus excite and pump light of the visible light region. In general, the light-emitting material is made from an organic material or inorganic material radiating fluorescence which is light emitted from singlet excitons, or luminescence which is light emitted from triplet excitons.

Preferably, light-emitting materials, whose light emission wavelengths respectively allow emission of blue, green, and red light, are employed singly or in combination. Examples of an organic fluorescent dye will be described hereinbelow.

No particular limitation is imposed on blue fluorescent material which can be employed in the second invention, so long as such material is an organic compound whose fluorescent peak wavelength in a solution state falls within a range of 380 to 480 nm; however, when employed, such a blue fluorescent material preferably contains at least one of a stilbene derivative, a distyryl arylene derivative, and a tristyryl arylene derivative. Other preferable examples of the blue fluorescent material include polycyclic aromatic compounds, such as anthracene, perylene, and coronene, and their alkyl derivatives.

No particular limitation is imposed on green fluorescent material which can be employed in the second invention, so long such material is an organic compound whose fluorescent peak wavelength in a solution state falls within the range of 480 to 580 nm. Specific examples of the green fluorescent material include coumarin compounds, such as 3-(2'-benzimidazolyl)-7-N,N-diethylamino-coumarin (coumarin 535), 3-(2-benzothiazolyl)-7-diethylamino-coumarine (coumarin 540), 2,3,5,6-1H,4H-tetrahydro-8-trifluoromethylquinolizino-<9,9a,1-gh>coumarin (coumarin 540A), 3-(5-chloro-2-benzothiazolyl)-7-diethylaminocoumarin (coumarin 34), 4-trifluoromethyl-piperidino[3,2-g]coumarin (coumarin 340), N-ethyl-4-trifluoromethyl-piperidino[3,2-g]coumarin (coumarin 355), N-methyl-4-trifluoromethyl-piperidino[2,3-h]coumarin, and 9-cyano-1,2,4,5-3H,6H,10H-tetrahydro-1-benzopyrano[9,9al-gh]quinolizin-10-one (coumarin 337); xanthine dyes, such as 2,7-dichlorofluorescen; tetracene; and quinacridone compounds.

No particular limitation is imposed on red fluorescent material which can be employed in the present invention, so long as such material is an organic compound whose fluorescent peak wavelength in a solution state falls within the range of 580 to 650 nm. Specific examples of the red oscillating laser dye include dicyanomethylene pyran derivatives, dicyanomethylene thiopyran derivatives, fluorescein derivatives, and perylene derivatives which are disclosed in Reference 12 for use as a red oscillating laser dye.

As described above, in the second invention, an arbitrary portion of the diffusion layer contains at least one kind of light-emitting material, wherein the ultra-fine particles, and fine particles whose particle size is greater than that of the ultra-fine particles are dispersed in the resin. Light emitted and radiated from the emissive layer is absorbed as an excitation light source by at least one kind of the light-emitting material, thereby emitting fluorescence or luminescence. Accordingly, there can be obtained an EL device of a type which utilizes the thus-emitted light as external light.

The second invention provides a planar light source characterized in having any of the above-described configurations, and a display characterized in employing the same, whereby the invention provides a highly luminous and highly efficient light-emitting device.

EXAMPLES

The present invention is now illustrated in greater detail with reference to Examples and Comparative Examples, but it should be understood that the present invention is not to be construed as being limited thereto.

Synthesis Example 1-1

29.89 g (171.6 mM) of tolylenediisocyanate (an isomer mixture: T-80, product of Mitsui Takeda Chemical Co.), 94.48 g (377.52 mM) of 4,4'-diphenylmethanediisocyanate, 64.92 g (308.88 mM) of naphthalenediisocyanate and 184.59 g of toluene were mixed in a 500 ml four-neck flask equipped with a stirrer, a dropping funnel, a reflux condenser and a thermometer. 8.71 g (51.48 mM) of 1-naphthylisocyanate and 0.82 g (4.29 mM) of 3-methyl-1-phenyl-2-phospholene-2-oxide were added to the mixture and under stirring, the whole was heated to 100° C. and held thereat for two hours. The progress of the reaction was ascertained by infrared spectroscopy. More specifically, observation was made of a decrease in absorption of the N—C—O stretching vibration of the isocyanate (2,270 $cm^{-1}$) and an increase in absorption of the N—C—N stretching vibration of the carbodiimide (2,135 $cm^{-1}$). The end point of the reaction was ascertained by IR and the reaction solution was cooled to room temperature to yield a polycarbodiimide resin solution.

Synthesis Example 1-2

89.01 g (355.68 mM) of 4,4'-diphenylmethanediisocyanate, 24.92 g (118.56 μM) of naphthalenediisocyanate, 44.87 g (266.76 mM) of hexamethylenediisocyanate and 216.56 g of toluene were mixed in a 500 ml four-neck flask equipped with a stirrer, a dropping funnel, a reflux condenser and a thermometer. 7.52 g (44.46 mM) of 1-naphthylisocyanate and 0.71 g (3.705 mM) of 3-methyl-1-phenyl-2-phospholene-2-oxide were added to the mixture, the whole was stirred at 25° C. for three hours and under stirring, the whole was then heated to 100° C. and held thereat for two hours. The progress of the reaction was ascertained by infrared spectroscopy, More specifically, observation was made of a decrease in absorption of the N—C—O stretching vibration of the isocyanate (2,270 $cm^{-1}$) and an increase in absorption of the N—C—N stretching vibration of the carbodiimide (2,135 $cm^{-1}$). The end point of the reaction was ascertained by IR and the reaction solution was cooled to room temperature to yield a polycarbodiimide resin solution.

The polycarbodiimide resins according to Synthesis Examples 1 and 2 above were tested for their refractive index as stated below. Each polycarbodiimide rsin solution was applied by coating on a separator formed by a polyethylene terephthalate film treated with a peeling agent and having a thickness of 50 μm and was heated at 130° C. for one minute and then at 150° C. for one minute to prepare a filmy sample having a thickness of 50 μm.

The sample was cut to form a specimen measuring 1 cm by 2 cm and after it was cured for one hour at each of 120° C., 150° C. and 175° C. in a curing oven, its refractive index was measured by a multi-wavelength Abbe Refractometer (DR-M4 made by ASTAGO).

The results were as shown in Table 1. The results confirmed that the polycarbodiimide resins according to Synthesis Examples 1-1 and 1-2 had a high refractive index as compared with any ordinary polymer resin and were suitable for use according to this invention.

TABLE 1

| | Refractive Index (wavelength: 587.6 nm) | | |
|---|---|---|---|
| | Cure at 120° C. | Cure at 150° C. | Cure at 175° C. |
| Synthesis Example 1 | 1.7571 | 1.7479 | 1.7443 |
| Synthesis Example 2 | 1.7343 | 1.7245 | 1.7230 |

Example 1-1

A toluene solution containing 70% by weight of silica particles having an average particle size of 0.5 μm was added to the polycarbodiimide resin solution as obtained in Synthesis Example 1-1 in the proportion of 20% by weight of the polycarbodiimide resin and the whole was stirred. The resulting dispersion was applied by an applicator to coat a glass substrate and was cured at 150° C. for one hour to form a transparent layer having a thickness of 25 μm and serving also as a light-diffusion layer on the glass substrate having a thickness of 1.1 mm. The refractive index of the glass substrate was measured with an Abbe refractometer and found to be 1.57 for the wavelength of 587.6 μm. The resulting sample had a haze of 87.3% as measured by a reflectance and transmittance meter (HR-100 of Murakami Color Research Laboratory).

Figure 7:
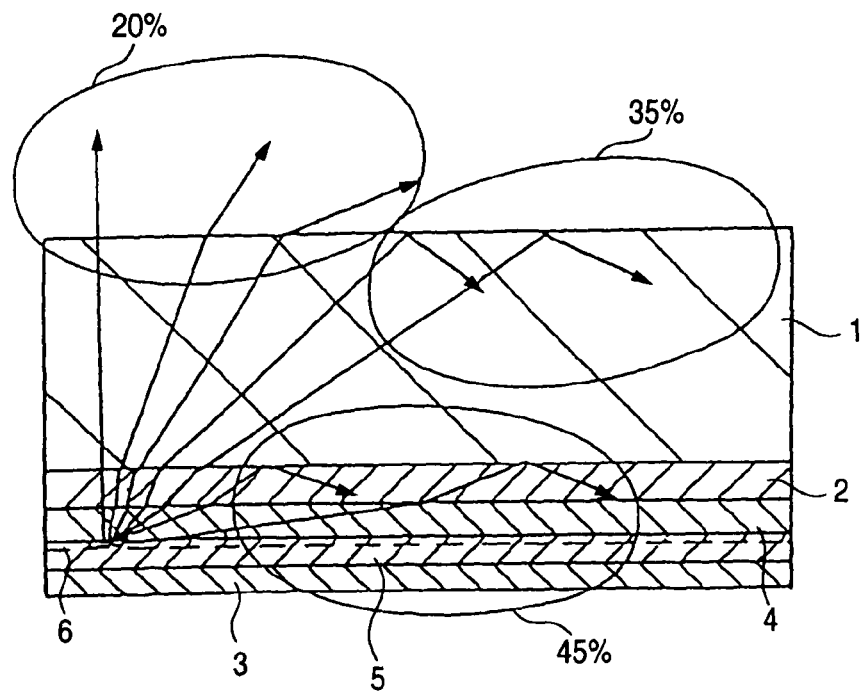
FIG. 7 is a drawing explaining the principle of the first invention.

Then, an ITO layer having a thickness of 100 nm was formed by DC sputtering from an ITO ceramic target ($In_2O_3$: $SnO_{2=90}$% by weight:10% by weight) to form a transparent electrode (anode) on the transparent layer serving also as the light-diffusion layer to prepare an organic EL device as shown in FIG. 3. Separately, an ITO layer was likewise formed as a transparent electrode (anode) on a glass substrate directly without forming any transparent layer serving as a light-diffusion layer to prepare an organic EL device as shown in FIG. 7.

Then, each transparent electrode was patterned to have a light-emitting area measuring 15 mm square by etching the ITO layer with a photoresist. It was cleansed with ozone by a low pressure ultraviolet lamp after ultrasonic cleansing.

Then, organic layers were formed on the ITO surface one after another by vacuum deposition. Firstly, a hole injection layer having a thickness of 15 nm was formed from CuPc as represented by formula (5) at a deposition rate of 0.3 nm/s.

Then, a hole transfer layer having a thickness of 50 nm was formed from α-NPD as represented by formula (6) at a deposition rate of 0.3 nm/s. Finally, an electron transfer light-emitting layer having a thickness of 140 nm was formed from Alq as represented by formula (7) at a deposition rate of 0.3 nm/s.

Then, a layer of MgAg having a thickness of 100 nm was formed by co-deposition of Mg and Ag at a deposition rate of 1 nm/s and 0.1 nm/s, respectively, and a layer of Ag having a thickness of 50 nm was formed on the MgAg layer to prevent its oxidation, whereby a reflective electrode (back electrode, or cathode) was formed.

After the element was removed from the vacuum deposition apparatus, an ultraviolet-curing epoxy resin was dropped onto the cathode, a glass slide was placed on the epoxy resin and when it was spread satisfactorily, the epoxy resin was cured by a high pressure ultraviolet lamp and the element was sealed.

(5)

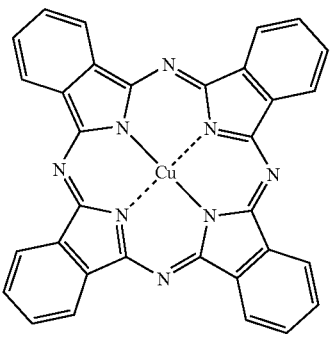

(6)

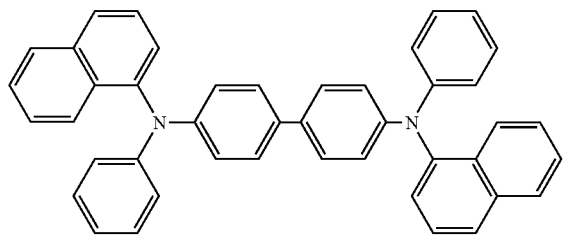

(7)

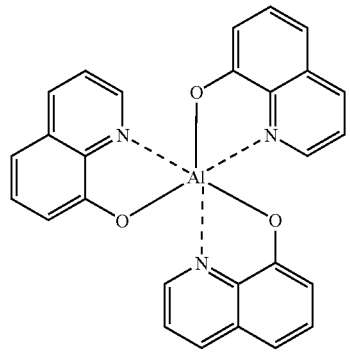

When a voltage of 15 V was applied to each organic EL device as prepared, an electric current was found to flow through it at a current density of 10.5 mA/cm² and the emission of light was observed.

The luminance of the organic EL device in which no transparent layer serving as a light-diffusion layer had been formed was measured every 10 degrees from 0 to 80 degrees by a commercially available luminance meter (BM9 of Topcon). The values of luminance as measured were 126 cd/m² at 0 degree, 138 cd/m² at 10 degrees, 154 cd/m² at 20 degrees, 181 cd/m² at 30 degrees, 225 cd/m² at 40 degrees, 272 cd/m² at 50 degrees, 307 cd/m² at 60 degrees, 386 cd/m² at 70 degrees and 339 cd/m² at 80 degrees.

As is obvious from the results, the organic EL device in which no transparent layer serving as a light-diffusion layer had been formed was found to satisfy fully the relation of formula (1) according to this invention. It was also found that substantially all the recombination of holes and electrons in this organic EL device occurred at the interface between α-NPD and Alq. Therefore, the distance d between the center of the region in which light was emitted by the recombination of holes and electrons and the reflective electrode according to this invention was about 140 nm.

When black light having an emission wavelength of 365 nm and employed as an exciting light source was radiated on an Alq film deposited on a glass substrate, its fluorescence spectrum showed a peak wavelength λ of about 530 nm. The Alq film showed a refractive index n of about 1.67 as measured by using a spectroscopic ellipsometer. Therefore, the above organic EL device was found to satisfy the relation of formula (2) according to this invention, too.

Then, the organic EL device of this invention having a transparent layer serving also as a light-diffusion layer showed a frontal luminance of 387 cd/m² as measured when a voltage of 15 V was applied to it, as described above.

Polycarbodiimide resin obtained in the synthesis example 1-1 and used as the matrix resin in the transparent layer which also serves as the light diffusion layer had a refractive index of 1.7479 when cured at 150° C. This refractive index is about 1.05 times that of Alq as the emissive layer and satisfies the requirement of the present invention.

As is obvious from the result, a great increase in frontal luminance from 126 to 387 cd/m² was confirmed with the organic EL device in which a transparent layer having a matrix of a highly refractive polycarbodiimide resin and serving also as a emissive layer had been formed on the transparent electrode of ITO in accordance with this invention, particularly the organic EL device satisfying the relations of formulas (1) and (2) according to this invention even when not having any such transparent layer formed therein.

Example 1-2

A light-diffusion layer was formed by using the polycarbodiimide resin solution according to Synthesis Example 1-2 instead of polycarbodiimide resin solution according to Synthesis Example 1-1 and otherwise repeating Example 1-1. The polycarbodiimide resin solution as obtained in Synthesis Example 1-2 (i.e., the resin solution not containing silica particles) was applied to coat the light-diffusion layer to form a transparent layer having a thickness of 25 μm. Example 1-1 was thereafter repeated to prepare an organic EL device as shown in FIG. 1. The device showed a frontal luminance of 543 cd/m² as measured by applying a voltage of 15 V thereto.

Example 1-3

A light-diffusion layer was formed by using the polycarbodiimide resin solution according to Synthesis Example 1-2 instead of polycarbodiimide resin solution according to Synthesis Example 1-1 and otherwise repeating Example 1-1. A dispersion obtained by dispersing fine titania particles in the polycarbodiimide resin solution as obtained in Synthesis Example 1-2 was applied to coat the light-diffusion layer to form a transparent layer having a thickness of 10 μm.

Example 1-1 was thereafter repeated to prepare an organic EL device as shown in FIG. 1. The device showed a frontal luminance of 633 cd/m² as measured by applying a voltage of 15 V thereto.

The "dispersion obtained by dispersing fine titania particles" had been prepared as stated below. The dispersion was prepared by adding fine $TiO_2$ particles (product of C I Chemical, spherical particles having an average particle size of 30 nm, a dispersion in a toluene solvent) to the polycarbodiimide resin solution according to Synthesis Example 1-2 in the proportion of 100 parts by weight for 100 parts by weight of the solid polycarbodiimide resin, and mixing them under stirring. The dispersion was applied onto a glass substrate by spin coating and its refractive index was 1.913 at a wavelength of 588 nm when measured by a spectroscopic ellipsometer (M220 of Nippon Bunko Company).

Comparative Example 1-1

An organic EL device was made by forming an electron transfer emissive layer having a thickness of 60 nm by the vapor deposition of Alq at a rate of 0.3 nm/s without forming any transparent layer serving as a light-diffusion layer and otherwise repeating Example 1-1. Its angle dependence of luminance was examined by applying a voltage of 8.2 V to it to pass an electric current therethrough at a current density of 10.5 mA/cm² ahd thereby cause it to emit light.

As a result, the values of luminance were 323 cd/m² at 0 degree, 323 cd/m² at 10 degrees, 319 cd/m² at 20 degrees, 315 cd/m² at 30 degrees, 302 cd/m² at 40 degrees, 286 cd/m² at 50 degrees, 269 cd/m² at 60 degrees, 244 cd/m² at 70 degrees and 202 cd/m² at 80 degrees.

As a result, the above organic EL device did not satisfy the relation of formula (1) according to this invention. The device did not satisfy the relation of formula (2) according to this invention, either, since the distance d between the center of the region in which light was emitted by the recombination of holes and electrons, and the reflective electrode according to this invention was about 60 nm.

Then, the same (transparent layer serving also as a) light-diffusion layer as had been formed in Example 1-1 was formed on the outermost glass substrate of the above organic EL device, and when its frontal luminance was measured, it was 362 cd/m². In other words, the formation of the light-diffusion layer hardly brought about any increase in luminance.

Example 1-4

A transparent layer also serving as a light diffusion layer was formed in a manner similar to Example 1-1, except that polycarbodiimide resin solution obtained in the synthesis Example 1-1 was used instead of that obtained in the Synthesis Example 1-1. The subsequent steps were performed similarly to Example 1-1, whereby an organic EL device was prepared. The front brightness of the organic EL device was measured with a voltage of 15V applied and found to be 367 cd/m². Thus, a brightness increase was confirmed.

Example 1-5

Instead of applying the dispersion containing silica particles onto the glass substrate in Example 1-1, the dispersion containing silica particles was applied onto a polyethylene terephthalate (PET) film whose obverse surface had been subjected to release treatment and cured at 150° C. for an hour to form a light diffusion layer having a thickness of 25 μm.

Subsequently, the polycarbodiimide resin solution itself obtained in the Synthesis Example 1-1 (i.e., the resin solution to which silica particles were not added) was applied onto the light diffusion layer and cured at 150° C. for an hour to form a transparent layer having a thickness of 25 μm.

By releasing from the PET film, a film layer (the light diffusion layer and the transparent layer) having a total thickness of 50 μm was obtained. The film layer was laminated and bonded to the glass substrate. Subsequent steps were performed similarly to Example 1-1, whereby an organic EL device as shown in FIG. 1 was prepared.

The front brightness of the organic EL device was measured with a voltage of 15V applied and found to be 543 cd/m². Thus, a brightness increase was confirmed.

Example 1-6

Polyethersulfone (PES) resin was dissolved in a solvent of N,N-dimethylacetamido (DMAc) at a concentration of 25 wt %, and a DMAc solution containing 70 wt % of silica particles having an average particle size of 0.5 μm was added thereto in a proportion of 20 wt % relative to PES and stirred. This dispersion was applied onto a glass substrate using an applicator and dried at 150° C. for 15 minutes to form a transparent layer also serving as a light diffusion layer and having a thickness of 25 μm.

The refractive index of the PES was measured with an Abbe refractometer and found to be 1.649 for a wavelength of 587.6 nm. The haze of this sample was measured with a reflectance and transmittance meter ("HR-100" manufactured by MURAKAMI COLOR RESEARCH LABORATORY) and found to be 84.7%.

The subsequent steps were performed similarly to Example 1-1, whereby an organic EL device as shown in FIG. 3 was prepared. The front brightness of the organic EL device was measured with a voltage of 15V applied and found to be 356 cd/m². Thus, a brightness increase was confirmed.

Comparative example 1-2

Toluene solution containing 70 wt % of silica particles having an average particle size of 0.5 μm was added to the polycarbodiimide resin solution obtained in the synthesis Example 1-1 in a proportion of 20 wt % relative to polycarbodiimide resin and stirred. This dispersion was applied onto a glass substrate using an applicator and dried at 150° C. for an hour. As a result, a transparent layer also serving as a light diffusion layer and having a thickness of 25 μm was formed on the glass substrate having a thickness of 1.1 mm.

Subsequently, on the surface side of the glass substrate opposite from the transparent layer also serving as the light diffusion layer, an ITO layer having a thickness of 100 nm was formed by DC sputtering from an ITO ceramic target ($In_2O_3$:$SnO_2$=90 wt %:10 wt %), whereby a transparent electrode (anode) was formed.

Thereafter, with respect to the transparent electrode, the ITO layer was etched using a photoresist to form a pattern for providing an emission area of 15 mm×15 mm. After ultrasonic cleaning, ozone cleaning with a low-pressure UV lamp was performed.

Figure 8:
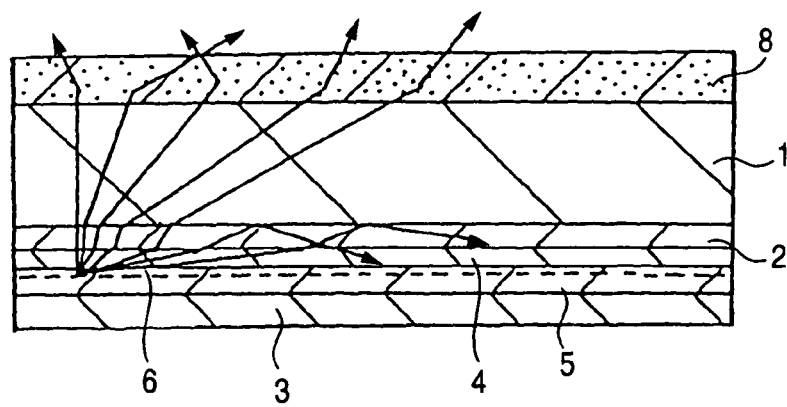
FIG. 8 is a drawing explaining the principle of a different aspect of the first invention.
Figure 9:
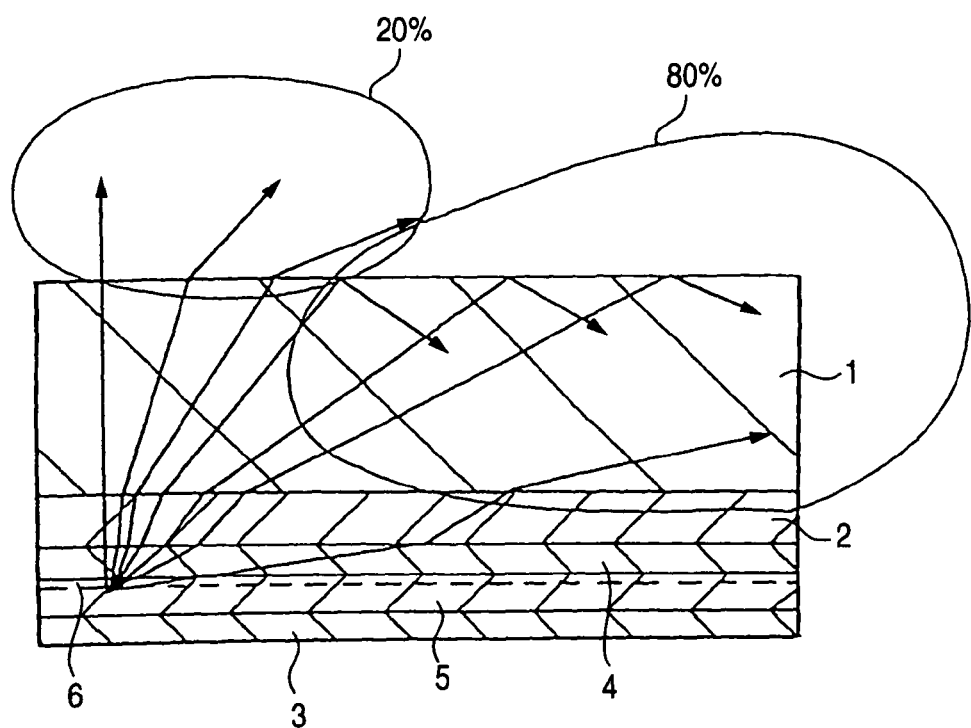
FIG. 9 is a drawing explaining the principle of a still another aspect of the first invention.
Figure 10:
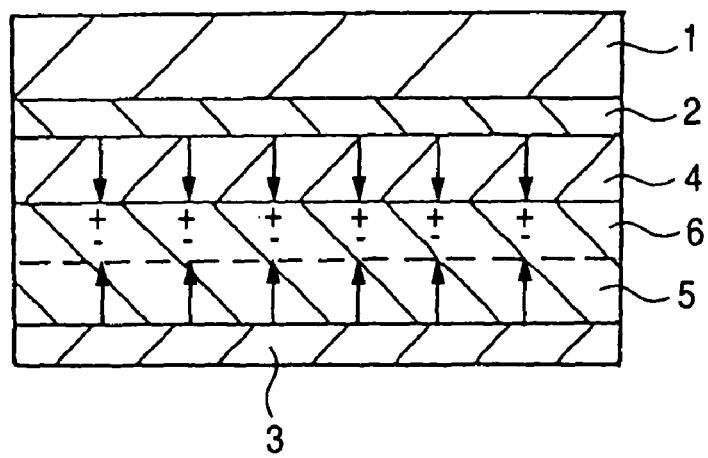
FIG. 10 is a diagram explaining the light-emitting region of an organic EL device.
Figure 11:
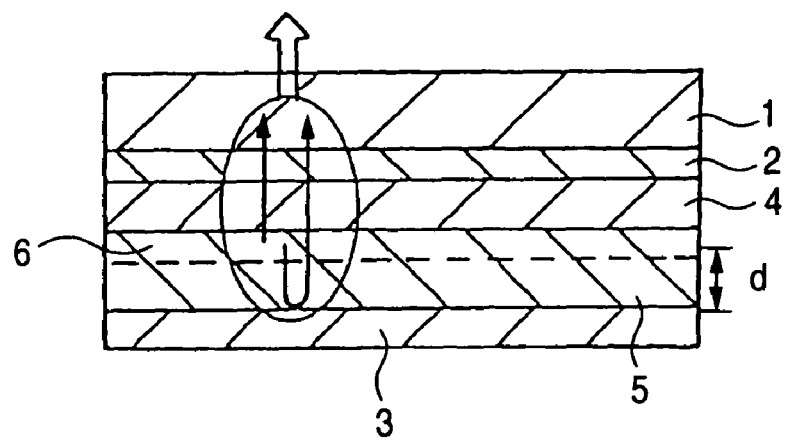
FIG. 11 is a diagram explaining the brightness of an organic EL device.

The subsequent steps were performed similarly to Example 1-1, whereby an organic EL device as shown in FIG. 8 was prepared. The front brightness of the organic EL device was measured with a voltage of 15V applied and found to be 278 d/m². In this way, in the case where a glass substrate of a low refractive index exists on the ITO transparent electrode, the brightness increase is small as compared with that in Example 1-1 even when a light diffusion layer is formed by using polycarbodiimide resin having a high refractive index as the matrix.

Comparative Example 1-3

An organic EL device was made by forming an electron transfer emissive layer having a thickness of 60 nm by the vapor deposition of Alq at a rate of 0.3 nm/s without forming any transparent layer serving as a light-diffusion layer and otherwise repeating Example 1-1. Its angle dependence of luminance was examined by applying a voltage of 8.2 V to it to pass an electric current therethrough at a current density of 10.5 mA/cm2 And thereby cause it to emit light.

As a result, the values of luminance were 323 cd/m2 at 0 degree, 323 cd/m2 at 10 degrees, 319 cd/m2 at 20 degrees, 315 cd/m2 at 30 degrees, 302 cd/m2 at 40 degrees, 286 cd/m2 at 50 degrees, 269 cd/m2 at 60 degrees, 244 cd/m2 at 70 degrees and 202 cd/m2 at 80 degrees.

As a result, the above organic EL device did not satisfy the relation of formula (1) according to this invention. The device did not satisfy the relation of formula (2) according to this invention, either, since the distance d between the center of the region in which light was emitted by the recombination of holes and electrons, and the reflective electrode according to this invention was about 60 nm.

Subsequently, an organic EL device was prepared similarly to Comparative example 1-2 except that an Alq layer was formed to have a thickness of 60 nm in a manner similar to the above. The front brightness of the organic EL device was measured with a voltage of 8.2V applied and found to be 335 cd/m².

In this way, when a light diffusion layer using polycarbodiimide resin of a high refractive index as the matrix was not formed on the ITO transparent electrode and the relationship of the formulae (0.1) and (2) was not satisfied, almost no brightness increase was observed.

Example 1-7

Acrylate-based UV curing resin having a refractive index of 1.65 ("GRANDIC PC2-720 series" manufactured by DAINIPPON INK AND CHEMICALS, INCORPORATED) was applied, using an applicator, to a mold to which square pyramid structures with 10 μm side at the base had been formed without leaving spaces, and irradiation of ultraviolet rays of 200 mJ/cm² using a high-pressure UV lamp was performed for curing.

To enhance the film strength, a solution obtained by dissolving PES resin in a DMAc solvent at a concentration of 25 wt % was further applied to the surface, dried at 120° C. for 20 minutes, and then removed from the mold, whereby a resin sheet having an irregular surface formed due to the pyramid structures was prepared.

Subsequently, on a PES resin surface of the resin sheet on the side which is opposite from the surface provided with the pyramid structures, an ITO film was formed to have a thickness of 100 nm. The subsequent steps were performed similarly to Example 1-1, whereby an organic EL device as shown in FIG. 5 was prepared.

The front brightness of the organic EL device was measured with a voltage of 15V applied and found to be 402 cd/m². Thus, achievement of high brightness was confirmed.

Example 1-8

To the irregular surface comprising the pyramid structures of the organic EL device prepared in Example 1-7, CARGILLE standard refractive index liquid having a refractive index of 1.40 was dropped to cover the 15 mm×15 mm area as the emission region of the organic EL device, whereby the irregular surface of the pyramid structures are smoothened in appearance.

The front brightness of the organic EL device was measured with a voltage of 15V applied and found to be 312 cd/m². Thus, the brightness increase was confirmed again, although the brightness is lower than that of Example 1-7.

Comparative Example 1-4

A quartz glass substrate (refractive index: 1.47) was subjected to surface roughening by reverse sputtering using argon gas until the average surface roughness became 0.05 μm. Polycarbodiimide resin solution obtained in the Synthesis Example 1 was applied to the glass surface by spin coating, cured at 150° C. for an hour, whereby a transparent layer having a thickness of 3 μm was formed.

Subsequently, on the transparent layer, an ITO film was formed to have a thickness of 100 nm. The subsequent steps were performed similarly to Example 1-1, whereby an organic EL device was prepared. The front brightness of the organic EL device was measured with a voltage of 15V applied and found to be 138 cd/m².

As is clear from the results, almost no brightness increase was observed when the surface roughness of the glass substrate is lower than the range of the present invention.

Example 2-1

Preparation of Diffusion Layer

Into 100 parts by weight of polyether sulfone ($n_0$=1.65), 54 parts by weight of titanium oxide ultra-fine particles ($n_1$=2.7) (volume fraction of the particles to the total amount of titanium oxide and polyether sulfone was 0.15) having a mean particle size of 18 nm was added in the form of a solution in solvent (N-methyl-2-pyrolidone). The mixture was subjected to processing by an ultrasonic homogenizer and a hybrid mixer, whereby a dispersion was prepared.

Subsequently, 5 parts by weight of silicone fine particles ($n_2$=1.43) having a mean particle size of 0.7 μm was added to the dispersion, and the resultant dispersion was sufficiently stirred. Thereafter, the dispersion was applied on one side of a glass substrate by means of an applicator for coating. Thereby, a diffusion layer having an after-drying thickness of 5 μm was prepared.

Preparation of Organic EL Device

An ITO film of 100 nm thickness was formed on the surface of a diffusion layer which had been prepared on a glass substrate by means of a DC sputtering method from an ITO ceramic target ($In_2O_3$:$SnO_2$=90% by weight:10% by weight), whereby a transparent electrode (anode) was prepared. Separately from the above, an ITO film was formed directly on a glass substrate in a similar manner with the above without forming a diffusion layer, whereby another transparent electrode (anode) was prepared.

Thereafter, the ITO film of each of the transparent electrodes was subjected to etching by use of a photoresist, and a pattern was formed so as to obtain a light-emitting area of 5 mm×5 mm, followed by ultrasonic cleaning, and ozone cleaning by use of a low-pressure mercury lamp.

Subsequently, an organic EL layer was sequentially formed on the ITO film by means of a vacuum deposition method, as follows. First, CuPc represented by the following formula (5) was formed to a thickness of 15 nm as a hole-injecting layer at a deposition rate of 0.3 nm/sec. Next, α-NPD represented by the following formula (6) was formed to a thickness of 50 nm as a hole transfer layer at a deposition rate of 0.3 nm/sec. Finally, Alq represented by the following formula (7) was formed to a thickness of 140 nm as an electron transport emissive layer at a deposition rate of 0.3 nm/sec.

(5)

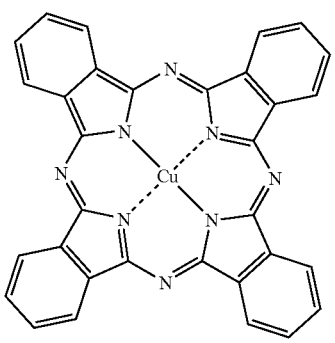

(6)

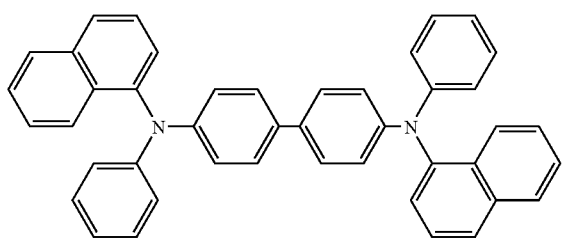

(7)

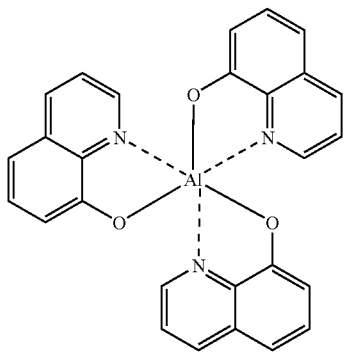

Thereafter, Mg and Ag were-co-deposited at deposition rates of 1 nm/sec and 0.1 nm/sec, respectively, whereby MgAg was formed to a thickness of 100 nm. Furthermore, for the purpose of preventing oxidization of MgAg, Ag was formed thereon to a thickness of 50 nm, whereby a reflective electrode (back plate) (cathode) was obtained.

After the device was taken out of a vacuum deposition apparatus, UV curing epoxy resin was dropped on the cathode electrode side of the device, and a slide glass was placed thereon. When the epoxy resin was sufficiently spread, the epoxy resin was cured by means of a high-pressure mercury lamp, to thus seal the device.

When the thus-prepared organic EL device of the invention and a conventional organic EL device on which a diffusion layer had not been formed were operated with a current density of 10 mA/cm$^2$, light emission was observed in each organic EL device.

Frontal luminance was measured by means of a commercially available luminance meter (BM9, manufactured by Topcon Corp.). As a result, a luminance value of 136 cd/cm$^2$ was obtained with the conventional organic EL device on which a diffusion layer had not been not formed, and 346 cd/m$^2$ was obtained with the organic EL device of the invention on which the diffusion layer had been formed. This result confirms that an organic EL device configured according to the invention is capable of greatly increasing the frontal luminance value.

Example 2-2

A diffusion layer was prepared in the same manner as in Example 2-1, except that titanium oxide ultra-fine particles ($n_1$=2.7) having a mean particle size was 36 nm were used, in the same amount, instead of the titanium ultra-fine particles ($n_1$=2.7) having a mean particle size of 18 nm. Thereafter, an organic EL device was prepared in the same manner as in Example 2-1.

When the thus-prepared organic EL device was operated with a current density of 10 mA/cm$^2$ in the same manner as in Example 2-1, light emission was observed. Frontal luminance was measured in the same manner as in Example 2-1, and a luminance value of 318 cd/m$^2$ was obtained. This result also confirmed that an organic EL device configured according to the invention is capable of greatly increasing the frontal luminance value.

Example 2-3

A diffusion layer was prepared in the same manner as in Example 2-1, except that silicone fine particles ($n_2$=1.43) having a mean particle size of 2 μm was used, in the same amount, instead of the silicone fine particles ($n_2$=1.43) having a mean particle size of 0.7 μm. Thereafter, an organic EL device was prepared in the same manner as in Example 2-1.

When the thus-prepared organic EL device was operated with a current density of 10 mA/cm$^2$ in the same manner as in Example 2-1, light emission was observed. Frontal luminance was measured in the same manner as in Example 2-1, and a luminance value of 332 cd/m$^2$ was obtained. This result also confirmed that an organic EL device configured according to the invention is capable of greatly increasing the frontal luminance value.

Example 2-4

Preparation of Diffusion Layer

Into 100 parts by weight of polyether sulfone ($n_0$=1.65), 107 parts by weight of zirconium oxide ultra-fine particles ($n_1$=2) (volume fraction of the particles to the total amount of zirconium oxide and polyether sulfone was 0.20) having a mean particle size of 45 nm was added in the form of a solution in solvent (N-methyl-2-pyrolidone). The mixture was subjected to processing by an ultrasonic homogenizer and a hybrid mixer, whereby a dispersion was prepared.

Subsequently, 5 parts by weight of silicone fine particles ($n_2$=1.43) having a mean particle size of 0.7 μm was added to the dispersion, and the resultant dispersion was sufficiently stirred. Thereafter, the dispersion was applied on one side of the glass substrate by means of an applicator for coating so that the thickness after drying became 5 μm. Thereby, a diffusion layer was prepared.

Preparation of Organic EL Device

Formation of a transparent electrode (anode) made from an ITO film, formation of a pattern, formation of an organic EL layer, formation of a reflective electrode (cathode), and sealing by means of epoxy resin were performed in the same manner as in Example 2-1 on the surface of the diffusion layer prepared on the glass substrate, whereby an organic EL device was prepared.

When the thus-prepared organic EL device was operated with a current density of 10 mA/cm² in the same manner as in Example 2-1, light emission was observed. The frontal luminance was measured in the same manner as in Example 2-1, and a luminance value of 276 cd/m² was obtained. This result also confirmed that an organic EL device configured according to the invention is capable of greatly increasing the frontal luminance value.

Example 2-5

Preparation of Diffusion Layer

Into 100 parts by weight of polyether sulfone ($n_0$=1.65), 54 parts by weight of titanium oxide ultra-fine particles ($n_1$=2.7) (volume fraction of the particles to the total amount of titanium oxide and polyether sulfone was 0.15) having a mean particle size was 18 nm was added in the form of a solution in solvent (N-methyl-2-pyrolidone). The mixture was subjected to processing by an ultrasonic homogenizer and a hybrid mixer, whereby a dispersion was prepared.

Subsequently, 5 parts by weight of silicone fine particles ($n_2$=1.43) having a mean particle size of 0.7 μm was added to the dispersion, and the resultant dispersion was sufficiently stirred. Thereafter, the dispersion was applied on a release paper by means of an applicator for coating, and dried. Consequently, a diffusion layer of 30 μm thickness was prepared.

Preparation of Organic EL Device

Formation of a transparent electrode (anode) made from an ITO film, formation of a pattern, formation of an organic EL layer, formation of a reflective electrode (cathode), and sealing by means of epoxy resin were performed in the same manner as in Example 2-1 on the surface of the above-mentioned diffusion film which serves as a support substrate, whereby an organic EL device was prepared.

When the thus-prepared organic EL device was operated with a current density of 10 mA/cm² in the same manner as in Example 2-1, light emission was observed. The frontal luminance was measured in the same manner as in Example 2-1, and a luminance value of 498 cd/m² was obtained. This result confirmed that an organic EL device configured according to of the invention is capable of greatly increasing the frontal luminance value.

Example 2-6

A diffusion film was prepared in the same manner as in Example 2-5, except that silicone fine particles ($n_2$=1.43) having a mean particle size of 6 μm were used, in the same amount, instead of the silicone fine particles ($n_2$=1.43) having a mean particle size of 0.7 μm. Thereafter, an organic EL device was prepared in the same manner as in Example 2-5.

When the thus-prepared organic EL device was operated with a current density of 10 mA/cm² in the same manner as in the Example 2-1, light emission was observed. The frontal luminance was measured in the same manner as in Example 2-1, and a luminance value of 435 cd/m² was obtained. This result also confirmed that an organic EL device configured according to the invention is capable of greatly increasing the frontal luminance value.

Comparative Example 2-1

Preparation of Diffusion Layer

Into 100 parts by weight of polyether sulfone ($n_0$=1.65), 5 parts by weight of silicone fine particles ($n_2$=1.43) having a mean particle size of 0.7 μm was added in the form of a solution in solvent (N-methyl-2-pyrolidone). The mixture was subjected to processing by an ultrasonic homogenizer and a hybrid mixer, whereby a dispersion was prepared. Thereafter, the dispersion was applied on one side of the glass substrate by means of an applicator for coating. Whereby, a diffusion layer having an after-drying thickness of 5 μm was prepared.

Preparation of Organic EL Device

Formation of a transparent electrode (anode) made from an ITO film, formation of a pattern, formation of an organic EL layer, formation of a reflective electrode (cathode), and sealing by means of epoxy resin were performed in the same manner as in Example 2-1 on the surface of the diffusion layer prepared on the glass substrate, whereby an organic EL device was prepared.

When the thus-prepared organic EL device was operated with a current density of 10 mA/cm² in the same manner as in Example 2-1, light emission was observed. The frontal luminance was measured in the same manner as in Example 2-1, and a luminance value of 182 cd/m² was obtained. This result confirmed that an organic EL device configured so as not to contain ultra-fine particles in the diffusion layer was incapable of appreciably increasing the frontal luminance value.

Comparative Example 2-2

Preparation of Non-Diffusion Layer

Into 100 parts by weight of polyether sulfone ($n_0$=1.65), 54 parts by weight of titanium oxide ultra-fine particles ($n_1$=2.7) (volume fraction of the particles to the total amount of titanium oxide and polyether sulfone was 0.15) having a mean particle size of 18 nm was added in the form of a solution in solvent (N-methyl-2-pyrolidone). The mixture was subjected to processing by an ultrasonic homogenizer and a hybrid mixer, whereby a dispersion was prepared. Thereafter, the dispersion was applied on one side of the glass substrate by means of an applicator for coating. Thereby, a non-diffusion layer having an after-drying thickness of 5 μm was prepared. In other words, since the non-diffusive layer contained no fine particles of large particle size, the non-diffusive layer had no light-scattering property and was transparent.

Preparation of Organic EL Device

Formation of a transparent electrode (anode) made from an ITO film, formation of a pattern, formation of an organic EL layer, formation of a reflective electrode (cathode), and sealing by means of epoxy resin were performed in the same manner as in Example 2-1 on the surface of the non-diffusion layer prepared on the glass substrate, whereby an organic EL device was prepared.

When the thus-prepared organic EL device was operated with a current density of 10 mA/cm² in the same manner as in Example 2-1, light emission was observed. The frontal luminance was measured in the same manner as in Example 2-1, and a luminance value of 143 cd/m² was obtained. As is apparent, this result confirmed that an organic EL device configured so as to contain ultra-fine particles but not fine particles having a particle size larger than that of the ultra-fine particles was incapable of appreciably increasing the frontal luminance value.

Comparative Example 2-3

Preparation of Non-Diffusion Layer

One hundred parts by weight of Polyether sulfone ($n_0$=1.65) was sufficiently stirred in a solvent (N-methyl-2-pyrolidone). Thereafter, the solvent was applied on one side of the glass substrate by means of an applicator for coating, whereby a non-diffusion layer having an after-drying thickness of 5 μm was prepared. The non-diffusive layer, which contained neither ultra-fine particles nor fine particles of large particle size, had no light-scattering property and was transparent.

Preparation of Organic EL Device

Formation of a transparent electrode (anode) made from an ITO film, formation of a pattern, formation of an organic EL layer, formation of a reflective electrode (cathode), and sealing by means of epoxy resin were performed, in the same manner as in Example 2-1, on the surface of the non-diffusion layer prepared on the glass substrate, whereby an organic EL device was prepared.

When the thus-prepared organic EL device was operated with a current density of 10 mA/cm² in the same manner as in Example 2-1, light emission was observed. Frontal luminance was measured in the same manner as in Example 2-1, and a luminance value of 136 cd/m² was obtained. As is apparent, this result confirmed that when an organic EL device was configured so as to include a non-diffusion layer containing neither ultra-fine particles nor fine particles—having a particle size larger than that of the ultra-fine particles—no increase in the frontal luminance value could be obtained.

Example 2-7

Preparation of Diffusion Layer

Into 100 parts by weight of polyether sulfone ($n_0$=1.65), 54 parts by weight of titanium oxide ultra-fine particles ($n_1$=2.7) (volume fraction of the particles to the total amount of titanium oxide and polyether sulfone was 0.15) having a mean particle size of 18 nm was added in the form of a solution in solvent (N-methyl-2-pyrolidone). The mixture was subjected to processing by an ultrasonic homogenizer and a hybrid mixer, whereby a dispersion was prepared.

Subsequently, 5 parts by weight of silicone fine particles ($n_2$=1.43), and as light-emitting materials, 0.31 parts by weight of Lumogen F Yellow-083 (manufactured by BASF Corporation) and 0.23 parts by weight of Lumogen F Red-305 (manufactured by BASF Corporation) were added into the dispersion, which was sufficiently stirred. Thereafter, the dispersion was applied on one side of the glass substrate by means of an applicator for coating. Thereby, a diffusion layer having an after-drying thickness of 5 μm was prepared.

Preparation of Organic EL Device

An ITO film of 100 nm thickness was formed on the surface of a diffusion layer which had been prepared on a glass substrate by means of DC sputtering method from an ITO ceramic target ($In_2O_3$:$SnO_2$=90% by weight:10% by weight), whereby a transparent electrode (anode) was prepared.

Thereafter, the ITO film of each of the transparent electrodes was subjected to etching by use of a photoresist, and a pattern was formed so as to obtain a light-emitting area of 5 mm×5 mm, followed by ultrasonic cleaning, and ozone cleaning by use of a low-pressure mercury lamp.

Subsequently, by reference to a method described in a reference (Junji. Kido, et al., Jpn. J. Appl. Phys. Vol. 32, Part 2, No. 7A, L917-L920 (1993)), an organic EL layer was sequentially formed on the ITO film so as to employ blue light emission as an excitation light, by means of a vacuum deposition method as follows.

First, CuPc represented by formula (5) was formed to a thickness of 15 nm as a hole-injecting layer at a deposition rate of 0.3 nm/sec. Next, TPD represented by formula (8) was formed to a thickness of 40 nm as a hole transfer blue emissive layer at a deposition rate of 0.3 nm/sec. Furthermore, TAZ represented by formula (9) was formed to a thickness of 15 nm as a hole-blocking layer, at a deposition rate of 0.3 nm/sec. Finally, Alq represented by formula (7) was formed to a thickness of 90 nm as an electron transport layer at a deposition rate of 0.3 nm/sec.

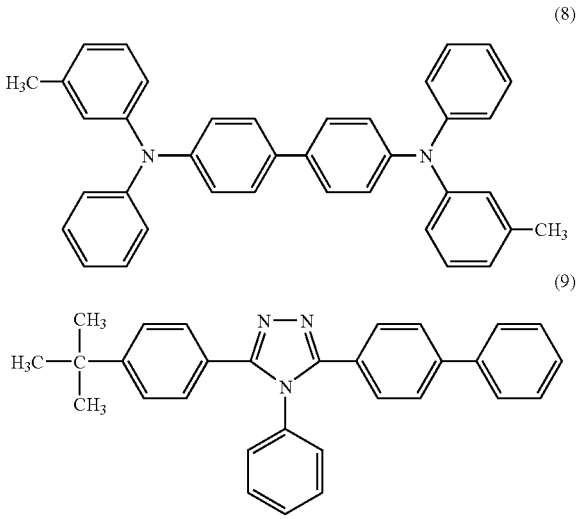

Thereafter, Mg and Ag were co-deposited at deposition rates of 1 nm/sec and 0.1 nm/sec, respectively, whereby MgAg was formed to a thickness of 100 nm. Furthermore, for the purpose of preventing oxidization of MgAg, Ag was formed thereon to a thickness of 50 nm, whereby a reflective electrode (back plate) (cathode) was obtained.

After the device was taken out of a vacuum deposition apparatus, UV curing epoxy resin was dropped on the cathode electrode side of the device, and a slide glass was placed thereon. When the epoxy resin was sufficiently spread, the epoxy resin was cured by means of a high-pressure mercury lamp, to thus seal the device.

When the thus-prepared organic EL device was operated with a current density of 10 mA/cm² in the same manner as in Example 2-1, emission of white light was observed. Frontal luminance was measured in the same manner as in Example 2-1, and a luminance value of 107 cd/m² was obtained. This result confirmed that an organic EL device configured according to the invention attained a large frontal luminance value.

Comparative Example 2-4

Preparation of Non-Diffusion Layer

Into 100 parts by weight of polyether sulfone ($n_0$=1.65), 54 parts by weight of titanium oxide ultra-fine particles ($n_1$=2.7) (volume fraction of the particles to the total amount of titanium oxide and polyether sulfone was 0.20) having a mean particle size of 18 nm, and as light-emitting materials, 0.31 parts by weight of Lumogen F Yellow-083 (manufactured by BASF Corporation) and 0.23 parts by weight of Lumogen F Red-305 (manufactured by BASF Corporation) were added in the form of a solution in solvent (N-methyl-2-pyrolidone). The mixture was sufficiently stirred, whereby a dispersion was prepared.

Next, the dispersion was applied on one side of the glass substrate by means of an applicator for coating, and a non-diffusion layer having an after-drying thickness of 5 pin was prepared. Since the non-diffusive layer did not contain fine particles of large particle size, the non-diffusive layer had no light-scattering property and was transparent.

Preparation of Organic EL Device

Formation of a transparent electrode (anode) made from an ITO film, formation of a pattern, formation of an organic EL layer, formation of a reflective electrode (cathode), and sealing by means of epoxy resin were performed in the same manner as in Example 2-7, on the surface of the non-diffusion layer prepared on the glass substrate, whereby an organic EL device was prepared.

When the thus-prepared organic EL device was operated with a current density of 10 mA/cm² in the same manner as in Example 2-1, emission of white light was observed. Frontal luminance was measured in the same manner as in Example 2-1, and a luminance value of 86 cd/m² was obtained. As is apparent, the result confirmed that the frontal luminance value was not increased with the organic EL device, which was configured so as to contain ultra-fine particles and light-emitting materials but not fine particles of larger particle size; that is, the configuration was inferior to that of Example 2-7.

This invention can provide an organic EL device of high light-emitting efficiency which makes it possible to emit efficiently waveguide light hitherto confined as lost light within the device, as described above. It is markedly different from any known organic EL device in that it permits the emission of light undergoing total internal reflection on the interface between the transparent electrode and the glass substrate which has hitherto been difficult. Further, the application of the organic EL device to a planar light source or a display device makes it possible to achieve a reduction in power consumption and a reduction in the amount of an electric current to be supplied to the device makes it possible to reduce the deterioration of its organic materials and thereby prolong its life.

Further, by the provision of the region for disturbing a reflection/refraction angle of light, a dark spot in the organic EL device becomes almost invisible, even if it is produced. Therefore, it is possible to provide an organic EL device whose appearance does not change for a long time.

While the present invention has been described in detail and with reference to specific embodiments thereof, it will be apparent to one skilled in the art that various changes and modifications can be made therein without departing the spirit and scope thereof.

The present application is based on Japanese Patent Application No. 2003-62553, 2003-433726, 2004-11452 filed on Mar. 7, 2003, Dec. 26, 2003 and Jan. 20, 2004, respectively, and the contents thereof are incorporated herein by reference.

What is claimed is:

1. An organic electroluminescence device comprising:
an organic layer comprising an emissive layer;
a pair of electrodes comprising an anode and a cathode, and sandwiching the organic layer, wherein at least one of the electrodes is transparent;
a transparent layer provided adjacent to a light extracting surface of the transparent electrode; and
a region substantially disturbing reflection and refraction angle of light provided adjacent to a light extracting surface of the transparent layer or in an interior of the transparent layer,
wherein the transparent layer has a refractive index substantially equal to or more than the refractive index of the emissive layer,
wherein the transparent layer comprises a polycarbodiimide resin represented by the following general formula (I):

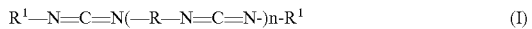

$$R^1\!-\!N\!=\!C\!=\!N(-\!R\!-\!N\!=\!C\!=\!N\text{-})n\text{-}R^1 \qquad (I)$$

wherein R, $R^1$ and n represent organic diisocyanate residue, organic monoisocyanate residue and an integer of 1 to 100, respectively.

2. The organic electroluminescence device according to claim 1, wherein the transparent layer has a refractive index of not less than 1.7.

3. The organic electroluminescence device according to claim 1, wherein the region substantially disturbing reflection and refraction angle of light comprises:
a first transparent material; and
a second transparent material or an opaque material having a mean particle size of 0.2 to 20 μm, and dispersed in the first transparent material,
wherein the second transparent material or the opaque material has a refractive index different from that of the first transparent material.

4. The organic electroluminescence device according to claim 1, wherein the region substantially disturbing reflection and refraction angle of light comprises a lens structure.

5. The organic electroluminescence device according to claim 1, wherein the region substantially disturbing reflection and refraction angle of light comprises an irregular surface having a surface roughness of not less than 1 μm.

6. The organic electroluminescence device according to claim 1, wherein not less than 10 mol % of organic diisocyanate residue R is naphthalene diisocyanate residue.

7. The organic electroluminescence device according to claim 1, wherein organic monoisocyanate residue $R^1$ is 1-naphthylisocyanate residue.

8. The organic electroluminescence device according to claim 1, wherein at least one kind of fine particles having a mean particle size of 1 to 100 nm are dispersed in the transparent layer.

9. The organic electroluminescence device according to claim 1, wherein the organic layer and the pair of electrodes are formed so that a front brightness and a brightness in 50 to 70 degrees direction of emitted light directed from the light extracting surface satisfy the formula (1) shown below, provided that the transparent layer and the region substantially disturbing reflection and refraction angle of light are not provided:

front brightness<brightness in 50 to 70 degrees direction (1).

10. The organic electroluminescence device according to claim 9, wherein the pair of electrodes comprise a reflective electrode and a transparent electrode, and further satisfy the following formula (2):

$$(0.3/n)\lambda < d < (0.5/n)\lambda \quad (2)$$

wherein d represents a distance (nm) between the center of an electron-hole recombination emission region and the reflective electrode, λ represents a peak wavelength of fluorescent spectrum of a material used for the emissive layer, and n represents a refractive index of the organic layer between the emissive layer and the reflective electrode.

11. A surface light source comprising an organic electroluminescence device according to claim 1.

12. A display comprising an organic electroluminescence device according to claim 1.

* * * * *